(12) United States Patent
Kim et al.

(10) Patent No.: US 12,336,338 B2
(45) Date of Patent: Jun. 17, 2025

(54) DISPLAY DEVICE AND METHOD OF MANUFACTURING THE SAME

(71) Applicant: Samsung Display Co., LTD., Yongin-si (KR)

(72) Inventors: Jin Wan Kim, Yongin-si (KR); Dae Ho Song, Yongin-si (KR); Byung Ju Lee, Yongin-si (KR); Seung Geun Lee, Yongin-si (KR); Jin Woo Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 425 days.

(21) Appl. No.: 17/707,327

(22) Filed: Mar. 29, 2022

(65) Prior Publication Data

US 2022/0352425 A1 Nov. 3, 2022

(30) Foreign Application Priority Data

Apr. 30, 2021 (KR) .................. 10-2021-0056841

(51) Int. Cl.
*H10H 20/831* (2025.01)
*H01L 25/075* (2006.01)
(Continued)

(52) U.S. Cl.
CPC ..... *H10H 20/8312* (2025.01); *H01L 25/0756* (2013.01); *H10H 20/01* (2025.01); *H10H 20/814* (2025.01); *H10H 20/825* (2025.01); *H10H 20/857* (2025.01); *H10H 29/142* (2025.01); *H10H 20/032* (2025.01); *H10H 20/0364* (2025.01)

(58) Field of Classification Search
CPC .................................................. H01L 27/156
See application file for complete search history.

(56) References Cited

U.S. PATENT DOCUMENTS 10,008,645 B2   6/2018   Bonar et al.
10,325,893 B2   6/2019   Chong et al.
(Continued)

FOREIGN PATENT DOCUMENTS

KR      10-1265727         5/2013
KR      10-2018-0118488    10/2018
(Continued)

*Primary Examiner* — Xiaoming Liu
(74) *Attorney, Agent, or Firm* — KILE PARK REED & HOUTTEMAN PLLC

(57) ABSTRACT

A display device includes pixels including a first pixel and a second pixel; a first electrode disposed in a light-emitting area of the first pixel; a first light-emitting element disposed on the first electrode and electrically connected to the first electrode, the first light-emitting element including a first light-emitting layer emitting light of a first color; a second electrode disposed in a light-emitting area of the second pixel; a second light-emitting element disposed on the second electrode and electrically connected to the second electrode, the second light-emitting element including a second light-emitting layer emitting light of a second color; and a bank disposed around the pixels to surround the light-emitting area of the first pixel and the light-emitting area of the second pixel, and including an inactive light-emitting layer of a same material as the first light-emitting layer.

9 Claims, 25 Drawing Sheets

(51) Int. Cl.
*H10H 20/01* (2025.01)
*H10H 20/814* (2025.01)
*H10H 20/825* (2025.01)
*H10H 20/857* (2025.01)
*H10H 29/14* (2025.01)

(56) References Cited

U.S. PATENT DOCUMENTS

| | | | |
|---|---|---|---|
| 10,431,717 | B1 | 10/2019 | Dasgupta et al. |
| 10,636,349 | B2 | 4/2020 | Shin et al. |
| 11,348,967 | B2 | 5/2022 | Park et al. |
| 2018/0277795 | A1* | 9/2018 | Liu ................... H10K 50/805 |
| 2020/0212102 | A1* | 7/2020 | Park ................... H01L 33/42 |

FOREIGN PATENT DOCUMENTS

| | | |
|---|---|---|
| KR | 10-1968592 | 4/2019 |
| KR | 10-2019-0094137 | 8/2019 |
| KR | 10-2019-0127666 | 11/2019 |
| KR | 10-2020-0083160 | 7/2020 |
| KR | 10-2153798 | 9/2020 |

* cited by examiner

M: M1', M2', M3', M4, M5, M6, M7

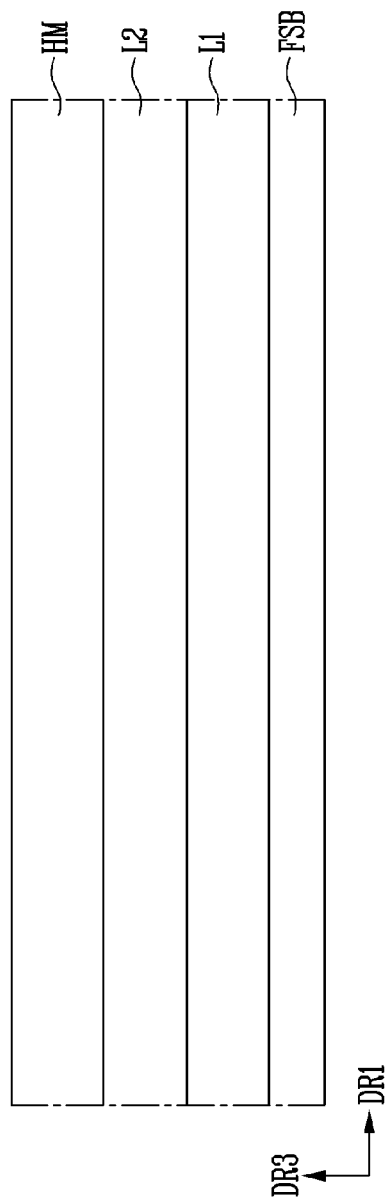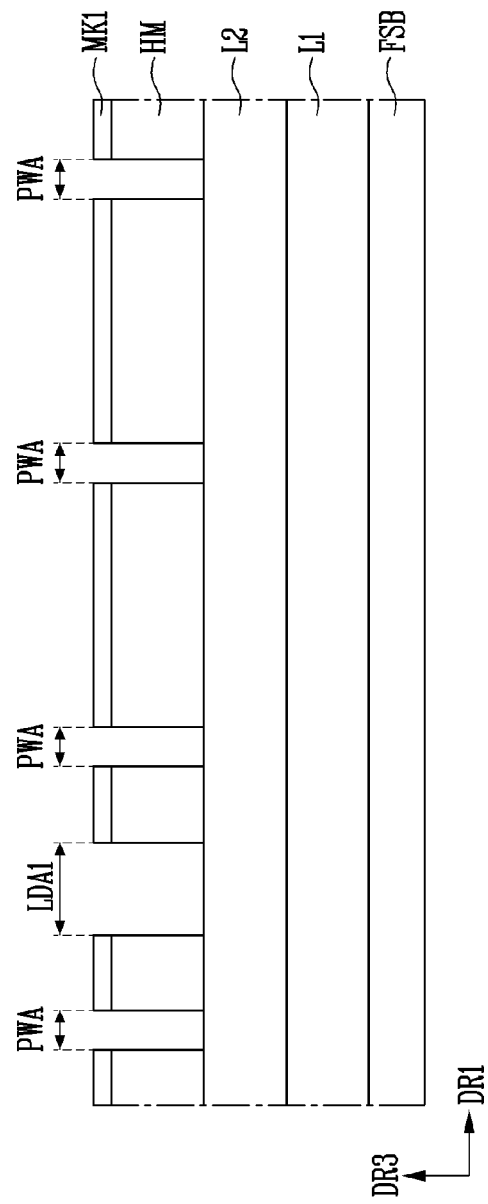

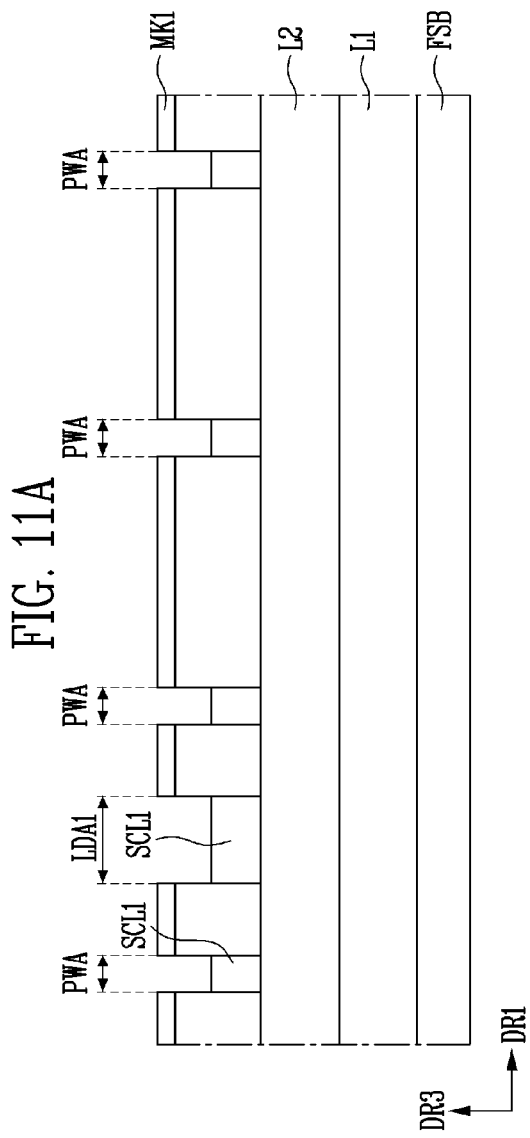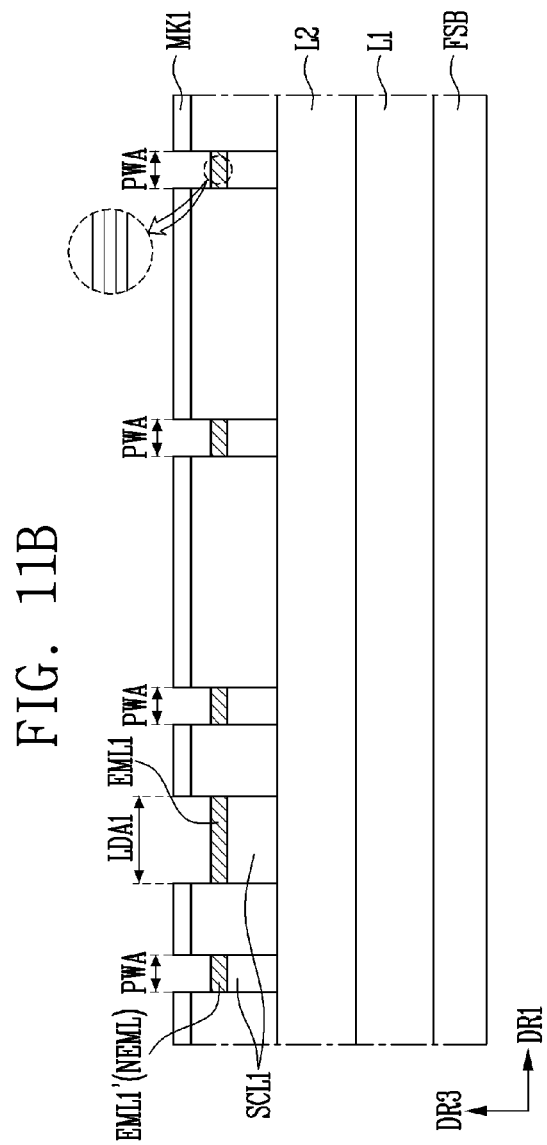

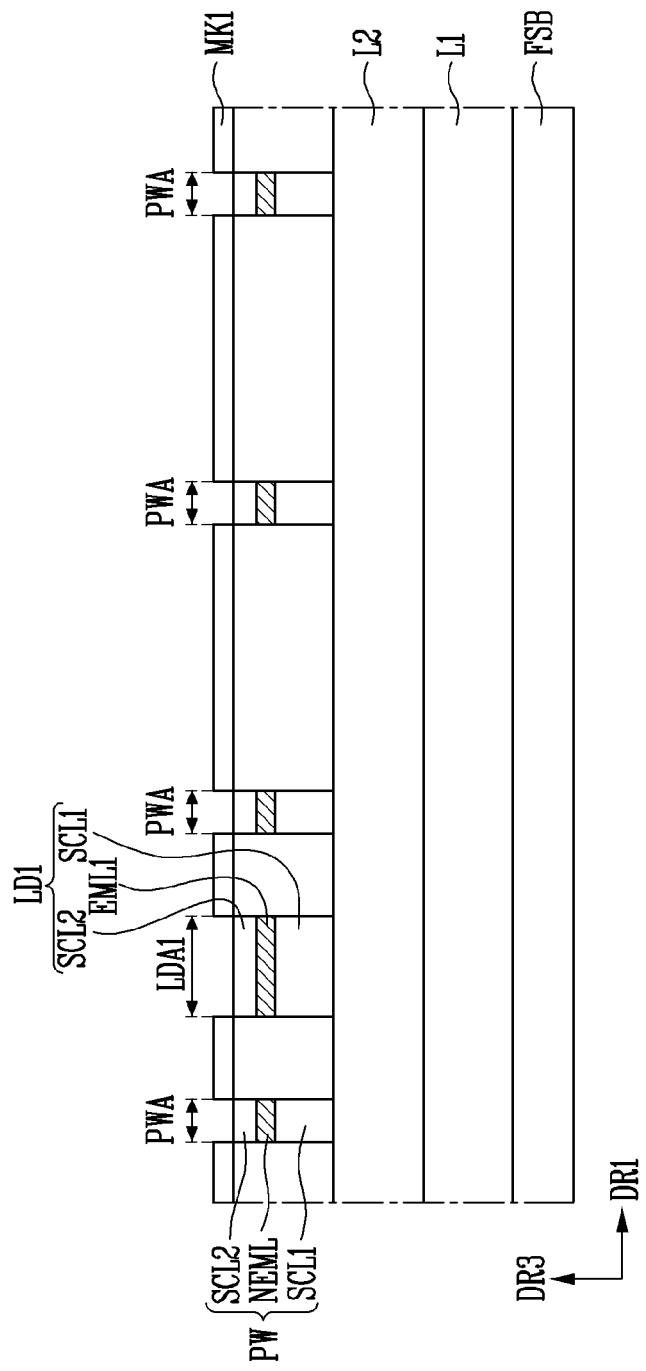

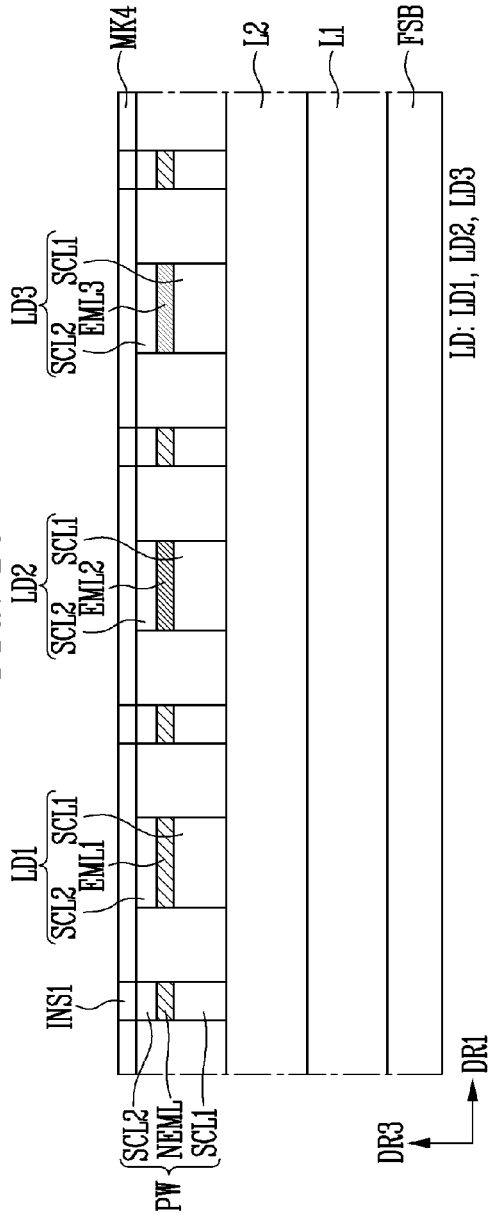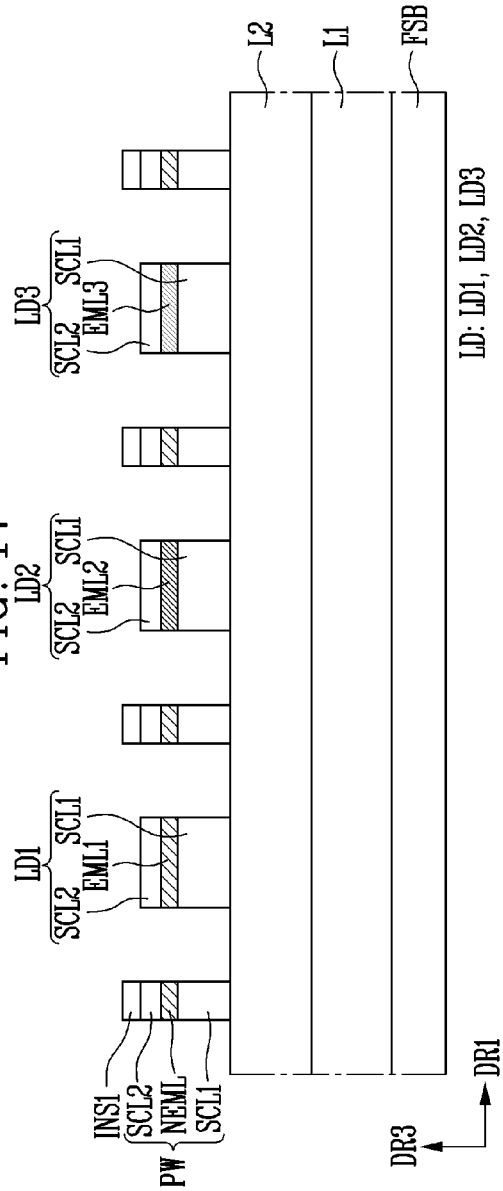

110: 110a, 110b

DISPLAY DEVICE AND METHOD OF MANUFACTURING THE SAME

CROSS-REFERENCE TO RELATED APPLICATION(S)

This application claims priority to and benefits of Korean Patent Application No. 10-2021-0056841 under 35 U.S.C. § 119 filed on Apr. 30, 2021 in the Korean Intellectual Property Office, the entire contents of which are incorporated herein by reference.

BACKGROUND

1. Technical Field

Embodiments of the disclosure relate to a display device and a manufacturing method thereof.

2. Description of the Related Art

Recently, interest in information displays is increasing. Accordingly, research and development for display devices are continuously being conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An object of the disclosure is to provide a display device including light-emitting elements emitting light of different colors and capable of improving manufacturing efficiency, and a manufacturing method thereof.

The object of the disclosure is not limited to the aforesaid, but other objects will be clearly understood by those skilled in the art from descriptions below.

A display device according to an embodiment may include pixels including a first pixel and a second pixel; a first electrode disposed in a light-emitting area of the first pixel; a first light-emitting element disposed on the first electrode and electrically connected to the first electrode, the first light-emitting element including a first light-emitting layer emitting light of a first color; a second electrode disposed in a light-emitting area of the second pixel; a second light-emitting element disposed on the second electrode and electrically connected to the second electrode, the second light-emitting element including a second light-emitting layer emitting light of a second color; and a bank disposed around the pixels to surround the light-emitting area of the first pixel and the light-emitting area of the second pixel, and including an inactive light-emitting layer of a same material as the first light-emitting layer.

In an embodiment, the first light-emitting element may include a light-emitting stack including the first light-emitting layer; a first semiconductor layer disposed on the first light-emitting layer; and a second semiconductor layer disposed between the first electrode and the first light-emitting layer. The bank may include a light-emitting stack, the light-emitting stack of the bank and the light-emitting stack of the first light-emitting element may have a same stacked structure.

In an embodiment, the display device may further include an insulator disposed on a surface of the bank that electrically isolates the bank.

In an embodiment, the first light-emitting layer and the inactive light-emitting layer may include a same nitride-based semiconductor material and may include multiple layers having a same stacked structure.

In an embodiment, the pixels may further include a third pixel. The third pixel may include a third electrode disposed in a light-emitting area of the third pixel; and a third light-emitting element disposed on the third electrode and electrically connected to the third electrode, and including a third light-emitting layer emitting light of a third color.

In an embodiment, the first light emitting element, the second light-emitting element, and the third light-emitting element and the bank may be disposed at a same height with respect to a substrate.

In an embodiment, the display device may further include a common electrode disposed on the first light emitting element, the second light-emitting element, and the third light-emitting element.

In an embodiment, the display device may further include a pad electrode disposed below the bank and electrically connected to the common electrode; and a first insulator disposed between the bank and the pad electrode.

In an embodiment, the display device may further include a reflective layer disposed on a side surface of the bank and surrounding the light-emitting areas of the first pixel, the second pixel, and the third pixel.

In an embodiment, the display device may further include at least one of: a first color filter, a second color filter, and a third color filter disposed on the first light emitting element, the second light-emitting element, and the third light-emitting element, respectively; a filler disposed below the first color filter, the second color filter, and the third color filter and adjacent to the first light emitting element, the second light-emitting element, the third light-emitting element, and the bank; and a black matrix disposed on the bank.

A method of manufacturing a display device according to an embodiment may include sequentially forming a buffer layer and a hard mask on a substrate; disposing a first mask on the hard mask, and etching the hard mask to form at least one trench in a first light-emitting element area and a bank area; forming a first light-emitting element and a bank in the first light-emitting element area and the bank area, respectively, by epitaxial growth; disposing a second mask on the hard mask, and etching the hard mask to form at least one trench in a second light-emitting element area; and forming a second light-emitting element in the second light-emitting element area by epitaxial growth.

In an embodiment, the forming of the first light-emitting element and the bank may include forming a first semiconductor layer in each of the first light-emitting element area and the bank area; forming a first light-emitting layer in each of the first light-emitting element area and the bank area; and forming a second semiconductor layer in each of the first light-emitting element area and the bank area.

In an embodiment, the forming of the second light-emitting element may include forming a first semiconductor layer in the second light-emitting element area; forming a second light-emitting layer having a different material or a different composition ratio from the first light-emitting layer in the second light-emitting element area; and forming a second semiconductor layer in the second light-emitting element area.

In an embodiment, the method of manufacturing the display device may further include disposing a third mask on the hard mask, and etching the hard mask to form at least one trench in a third light-emitting element area; forming a third light-emitting element in the third light-emitting element area by epitaxial growth; forming a first insulator on the bank; and removing the hard mask.

In an embodiment, the method of manufacturing the display device may further include providing a driving substrate including a first electrode, a second electrode, a third electrode, and a pad electrode; aligning the substrate on the driving substrate so that the first electrode, the second electrode, and the third electrode face the first light-emitting element, the second light-emitting element, and the third light-emitting element, respectively; connecting the driving substrate and the substrate so that the first electrode, the second electrode, and the third electrode are electrically connected to the first light-emitting element, the second light-emitting element, and the third light-emitting element, respectively; and removing the substrate.

In an embodiment, the method of manufacturing the display device may further include forming an insulating film on side surfaces of the first light emitting element, the second light-emitting element, and the third light-emitting element, and forming a second insulator on a surface of the bank; and forming a common electrode on the first light emitting element, the second light-emitting element, and the third light-emitting element and the pad electrode to electrically contact a portion of the first light emitting element, the second light-emitting element, and the third light-emitting element and a portion of the pad electrode.

In an embodiment, the method of manufacturing the display device may further include forming a reflective layer on the bank; and forming a filler in a space between the first light emitting element, the second light-emitting element, and the third light-emitting element and the bank.

Other embodiments are included in specification and drawings.

According to a display device according to embodiments of the disclosure and a manufacturing method thereof, a display device having a simplified structure and a reduced thickness is provided by disposing light-emitting elements of different colors in pixels for emitting light of different colors.

According to the display device according to embodiments and the manufacturing method thereof, the light-emitting elements of different colors may be formed on one manufacturing substrate. Accordingly, a bonding process for connecting the light-emitting elements of different colors to a driving substrate may be simplified or minimized, and manufacturing efficiency of the display device may be improved.

According to the display device according to embodiments and the manufacturing method thereof, the partition wall (or, bank) surrounding the light-emitting areas of the pixels may be formed simultaneously with the light-emitting elements of the first color provided to the first pixels. Accordingly, the manufacturing process of the display device may be simplified and the manufacturing efficiency may be increased.

Effects according to embodiments are not limited by contents described above, and more various effects are included in the specification.

BRIEF DESCRIPTION OF THE DRAWINGS

The above and other aspects and features of the disclosure will become more apparent by describing in detail embodiments thereof with reference to the attached drawings, in which:

FIGS. 9 to 24 are schematic cross-sectional views illustrating a manufacturing method of a display device according to an embodiment.

DETAILED DESCRIPTION OF THE EMBODIMENTS

Figure 1:
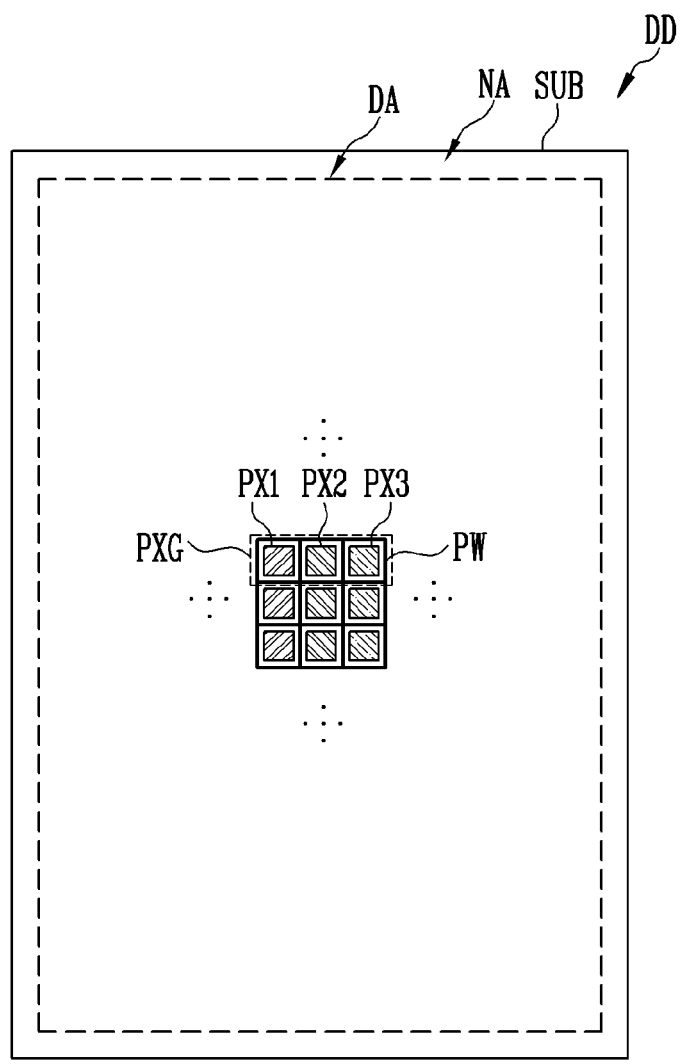
FIGS. 1 and 2 are schematic plan views illustrating a display device according to respective embodiments.

It will be apparent to those skilled in the art that various modifications and variations can be made in the disclosure without departing from the spirit or scope of the disclosure, and embodiments are illustrated in the drawings and explained in the detailed description. The terms of a singular form may include plural forms unless referred to the contrary. For example, as used herein, the singular forms, "a," "an," and "the" are intended to include the plural forms as well, unless the context clearly indicates otherwise.

The disclosure is not limited to embodiments disclosed below, and may be implemented in various forms. Each of the embodiments disclosed below may be implemented alone, or may be implemented in combination with at least one other embodiment.

In the drawings, some constituent elements which may not be directly related to features of the disclosure may be omitted in order to clearly indicate the disclosure. For the same or similar constituent elements throughout a drawing or drawings, the same reference numerals and symbols are to be given as much as possible even if they are displayed on different drawings, and duplicate descriptions may be omitted.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

In describing the embodiments, the term "connection (or coupling)" may mean a physical and/or electrical connection (or coupling) collectively. In addition, this may mean a direct or indirect connection (or coupling) and an integral or non-integrated connection collectively.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
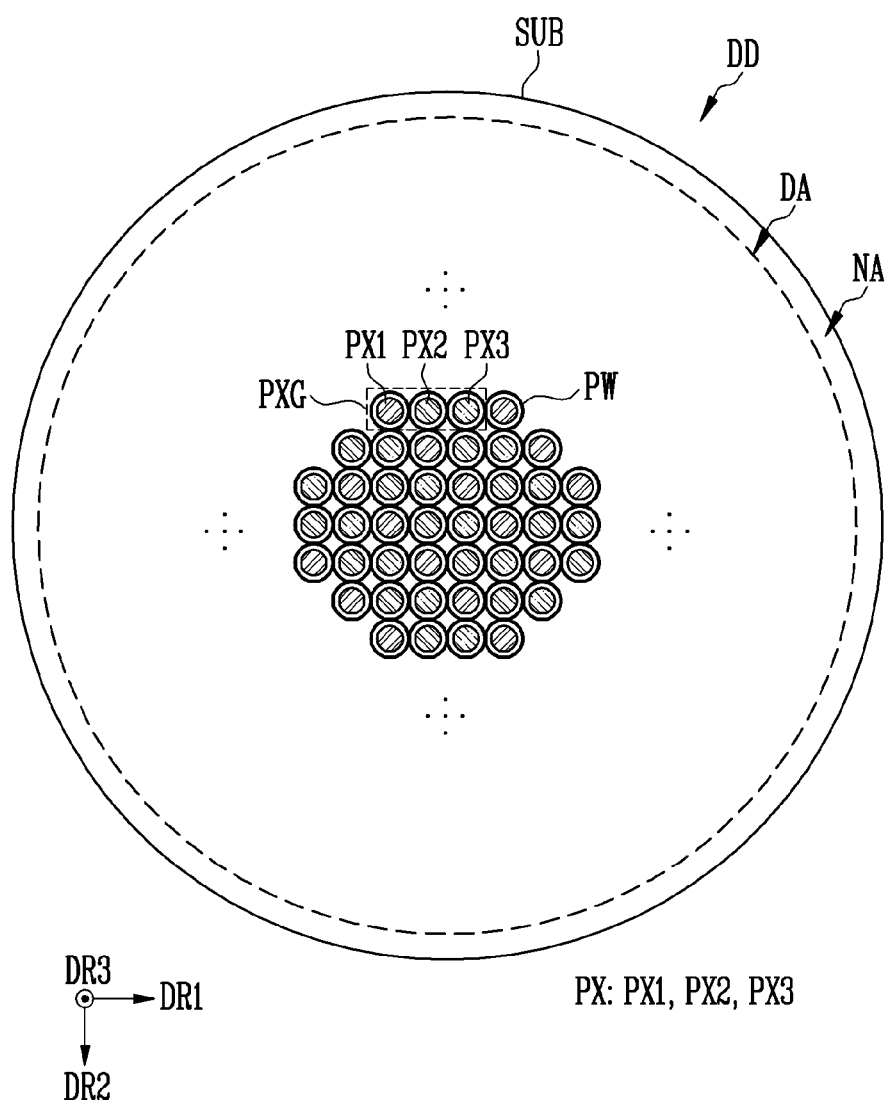

FIGS. 1 and 2 are schematic plan views illustrating a display device DD according to respective embodiments.

FIGS. 1 and 2 illustrate different embodiments with regard to shapes of the pixels PX and the display device DD, and arrangement structures of the pixels PX.

In FIGS. 1 and 2, the structure of the display device DD will be briefly illustrated centering on the display panel including the display area DA. The display device DD may further include a driving circuit (for example, a driving circuit including a scan driver, a data driver, a timing controller, and the like) for driving the pixels PX. In an embodiment, at least a portion of the driving circuit may be formed and/or disposed inside the display panel, and in an embodiment, the driving circuit may be provided outside the display panel to be electrically connected to the display panel.

Referring to FIGS. 1 and 2, the display device DD may include a substrate SUB and pixels PX disposed on the substrate SUB.

The substrate SUB may be a base member for constituting the display device DD, and, for example, may form a base surface of the display device DD. The substrate SUB may include a display area DA in which the pixels PX are disposed, and a non-display area NA except for the display area DA. The display area DA may constitute a screen on which an image is displayed, and the non-display area NA may be an area other than the display area DA.

The display device DD may be provided in various shapes. For example, the display device DD may be provided as a panel having a quadrangle shape as in the embodiment of FIG. 1, but is not limited thereto. For example, the display device DD may be provided as a panel having a circular shape or an elliptical shape, as in the embodiment of FIG. 2. The display device DD may have various shapes. Also, the display device DD may be provided as a flat panel or as a 3D panel having a curvature in a thickness direction or the like within the spirit and the scope of the disclosure. It is also to be understood that the shapes disclosed herein may also include substantial shapes to those disclosed herein.

For convenience, in FIGS. 1 and 2, the display device DD will be illustrated as having a rectangular or circular flat plate shape. A horizontal direction (row direction or X direction) of the display device DD will be referred to a first direction DR1, a vertical direction (column direction or Y direction) of the display device DD will be referred to a second direction DR2, and a thickness direction (or height direction) of the display device DD will be referred to a third direction DR3.

The display area DA may have various shapes. For example, the display area DA may have a rectangular shape as in the embodiment of FIG. 1, or may have a circular shape as in the embodiment of FIG. 2. The display area DA may have various shapes as well.

In an embodiment, the display area DA may have a shape conforming to the shape of the display device DD. For example, in case that the display device DD is provided in a quadrangular shape, the display area DA may be provided in a quadrangular shape conforming to the size and/or shape of the display device DD. By way of example, in case that the display device DD is provided in a circular or elliptical shape, the display area DA may be provided in a circular or elliptical shape conforming to the size and/or shape of the display device DD.

The disclosure, however, is not limited thereto. For example, the display area DA may have a different shape from the display device DD.

Pixels PX may be arranged or disposed in the display area DA. For example, the display area DA may include pixel areas in which each pixel PX is provided and/or disposed, and each pixel PX may be disposed in each pixel area on the substrate SUB.

The display device DD may include pixels PX emitting light of different colors. For example, the display device DD may include first pixels PX1 emitting light of a first color, second pixels PX2 emitting light of a second color, and third pixels PX3 emitting light of a third color. At least one first pixel PX1, at least one second pixel PX2, and at least one third pixel PX3 disposed adjacent to each other may constitute one pixel group PXG. By individually controlling light-emitting luminance of the first, second, and third pixels PX1, PX2, and PX3 constituting each pixel group PXG, the pixel group PXG may display various colors.

In an embodiment, the first pixel PX1 may emit light of the first color by including a light-emitting element of the first color (hereinafter, referred to as "first light-emitting element"). The second pixel PX2 may emit light of the second color by including a light-emitting element of the second color (hereinafter, referred to as a "second light-emitting element"). The third pixel PX3 may emit light of the third color by including a light-emitting element of the third color (hereinafter, referred to as a "third light-emitting element").

In an embodiment, the first color, the second color, and the third color may be different from each other. For example, the first pixel PX1, the second pixel PX2, and the third pixel PX3 may include the first light-emitting element emitting blue light, the second light-emitting element emitting green light, and the third light-emitting element emitting red light, respectively. Accordingly, the first pixel PX1, the second pixel PX2, and the third pixel PX3 may emit blue, green, and red light, respectively.

The disclosure, however, is not limited thereto. For example, the type of light-emitting element included in each pixel PX, the color of light emitted from each pixel PX, and the number and/or the type of pixels PX constituting each pixel group PXG, and the like may be variously changed according to embodiments.

Each pixel PX may include at least one light-emitting element driven by a control signal (for example, a scan signal and a data signal) and/or power (for example, a first power and a second power). In an embodiment, the light-emitting element may be an inorganic light-emitting diode including a nitride-based semiconductor material, and may have a small size ranging from nanometers to micrometers. For example, the light-emitting element may have a diameter, width, length, and/or thickness in the range of tens of nanometers to tens of micrometers. The light-emitting element may include a light-emitting stack including a second semiconductor layer, a light-emitting layer, and a first semiconductor layer sequentially stacked each other along one direction or a direction (for example, a length or thickness direction). However, the type, size, and/or shape of the light-emitting element that can be provided in the pixel PX of the disclosure is not limited thereto, and this may be variously changed according to embodiments.

The pixels PX may have a structure according to at least one of the embodiments to be described later. For example, the pixels PX may have a structure to which one of the embodiments to be described later is applied, or may have a structure to which at least two embodiments of the embodiments to be described later are applied in combination.

The pixels PX may be arranged or disposed in the display area DA according to various arrangement structures. For example, as in the embodiment of FIG. 1, the first pixels PX1, the second pixels PX2, and the third pixels PX3 may be arranged or disposed in a stripe shape in pixel rows extending along the first direction DR1 and pixel columns extending along the second direction DR2. By way of example, as in the embodiment of FIG. 2, the first pixels PX1, the second pixels PX2, or the third pixels PX3 may be arranged or disposed along a diagonal direction inclined with respect to the first and second directions DR1 and DR2 (for example, in a diagonal direction of the display device DD). The arrangement structure of the pixels PX may be variously changed. For example, the pixels PX may be arranged or disposed in the display area DA according to a PENTILE™ arrangement structure or the like within the spirit and the scope of the disclosure.

A partition wall PW (also referred to as a "bank", a "wall pattern", or a "pixel definition layer") surrounding the pixels PX may be further disposed in the display area DA. For example, the partition wall PW may be disposed around the pixels PX so as to surround the light-emitting areas of the pixels PX in which at least one light-emitting element may be disposed, respectively.

In an embodiment, the partition wall PW may be formed as an integral mesh-like pattern that may be disposed between the pixels PX and/or around the display area DA, and that may include openings corresponding to each of the pixels PX (or the light-emitting areas of the pixels PX). For example, the partition wall PW may include the openings corresponding to the pixels PX, and may be entirely connected in the display area DA.

A non-display area NA may be disposed around the display area DA. Lines, internal circuit units or circuits, and/or pads connected to the pixels PX of the display area DA may be disposed in the non-display area NA.

Figure 3:
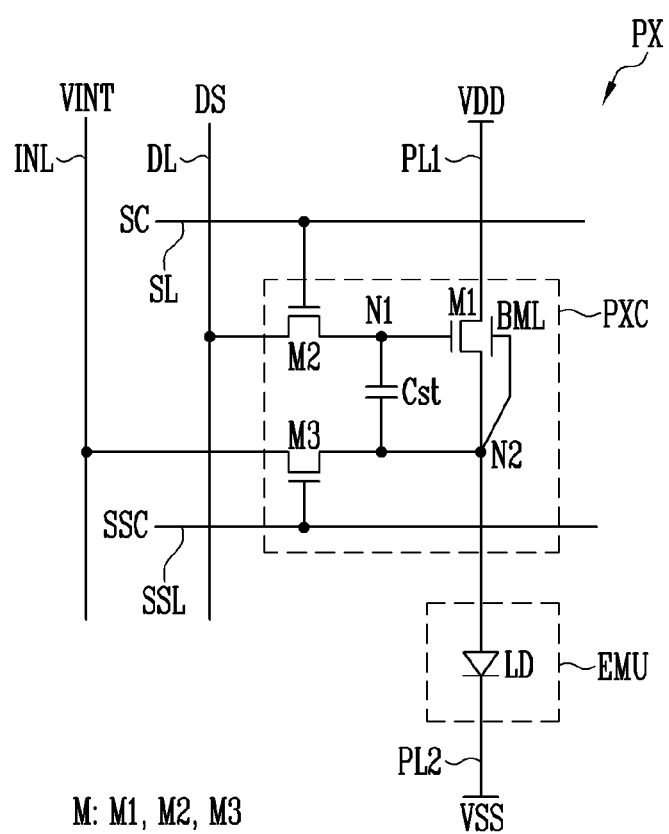
FIGS. 3 and 4 are schematic diagrams of an equivalent circuit of a pixel illustrating a pixel according to respective embodiments.
Figure 4:
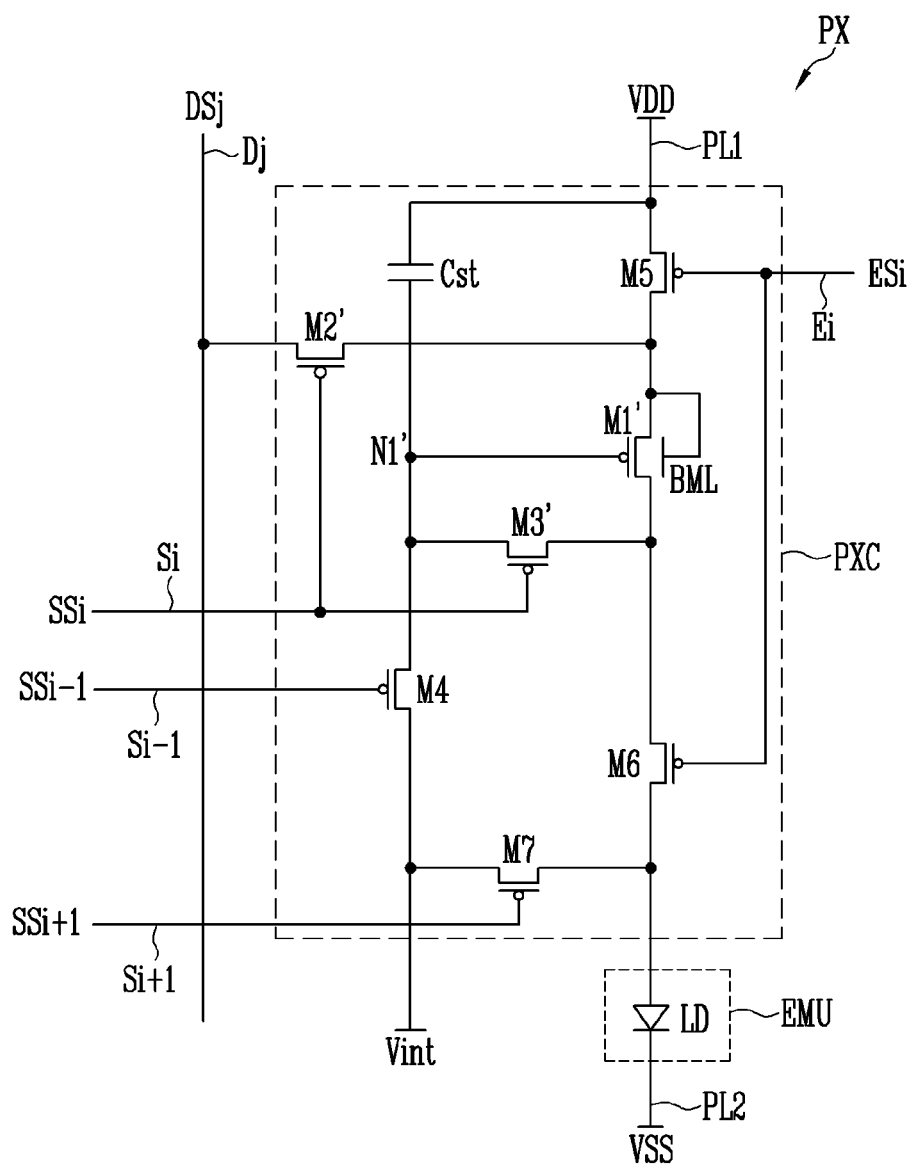

FIGS. 3 and 4 are schematic diagram of an equivalent circuit of a pixel illustrating a pixel PX according to respective embodiments. For example, FIGS. 3 and 4 illustrate pixels PX including pixel circuits PXC having different structures.

According to an embodiment, each pixel PX illustrated in FIGS. 3 and 4 may be any one of the pixels PX disposed in the display area DA of FIGS. 1 and 2. For example, the pixel PX may be any one of the first pixel PX1, the second pixel PX2, or the third pixel PX3. Also, the pixels PX disposed in the display area DA may have substantially the same or similar structure to each other. The pixels PX may have various structures in addition to the structures disclosed in the embodiments of FIGS. 3 and 4.

Referring to FIG. 3, the pixel PX may be connected to a scan line SL, a data line DL, a first power line PL1 and a second power line PL2. Also, the pixel PX may be selectively further connected to at least one other power line and/or signal line. For example, the pixel PX may be further connected to an initialization power line INL (or a sensing line) and/or a control line SSL. The voltage of the second power VSS is supplied to the second power line PL2.

The pixel PX may include a light-emitting unit EMU for generating light having a luminance corresponding to each data signal DS. The light-emitting unit EMU may include at least one light-emitting element LD. The pixel PX may selectively further include a pixel circuit PXC for driving the light-emitting unit EMU.

The pixel circuit PXC may be connected to the scan line SL and the data line DL, and may be connected between the first power line PL1 and the light-emitting unit EMU. For example, the pixel circuit PXC may be connected to the scan line SL to which the scan signal SC is supplied, the data line DL to which the data signal DS is supplied, and the first power line PL1 to which E is supplied, and the light-emitting unit EMU. Further, the pixel circuit PXC may be selectively further connected to the control line SSL to which the control signal SSC is supplied, and the initialization power line INL connected to the initialization power VINT or the sensing circuit corresponding to a display period or a sensing period.

In an embodiment, the control signal SSC may be the same as or different from the scan signal SC. In case that the control signal SSC is the same signal as the scan signal SC, the control line SSL may be selectively integrated with the scan line SL.

The pixel circuit PXC may include at least one transistor M and a capacitor Cst. For example, the pixel circuit PXC may include a first transistor M1, a second transistor M2, a third transistor M3, and a capacitor Cst.

The first transistor M1 may be connected between the first power line PL1 and the second node N2. The second node N2 may be a node to which the pixel circuit PXC and the light-emitting unit EMU are connected. For example, the second node N2 may be a node to which one electrode (for example, a source electrode) of the first transistor M1 and one electrode (for example, an anode electrode of the light-emitting unit EMU) of the light-emitting unit EMU are connected. A gate electrode of the first transistor M1 may be connected to the first node N1. The first transistor M1 may control a driving current supplied to the light-emitting unit EMU in response to a voltage of the first node N1. For example, the first transistor M1 may be a driving transistor of the pixel PX.

In an embodiment, the first transistor M1 may further include a bottom metal layer BML (also referred to as a "second gate electrode" or a "back gate electrode"). In an embodiment, the bottom metal layer BML may be connected to one electrode (for example, a source electrode) of the first transistor M1.

In an embodiment in which the first transistor M1 may include the bottom metal layer BML, a back-biasing technology (or a sync technology) may be applied, the back-biasing technology can move in a negative or positive direction the threshold voltage of the first transistor M1 by applying a back-biasing voltage to the bottom metal layer BML of the first transistor M1. In in case that the bottom metal layer BML may be disposed so as to overlap a semiconductor pattern constituting a channel of the first transistor M1, operation characteristics of the first transistor M1 can be stabilized by blocking light incident on the semiconductor pattern.

The second transistor M2 may be connected between the data line DL and the first node N1. A gate electrode of the second transistor M2 may be connected to the scan line SL. The second transistor M2 may be turned on in case that a scan signal SC having a gate-on voltage (for example, a logic high voltage or a high level voltage) is supplied from the scan line SL to connect the data line DL and the first node N1.

For each frame period, the data signal DS of the corresponding frame may be supplied to the data line DL, and the data signal DS may be transferred to the first node N1 through the second transistor M2 during a period in case that the scan signal SC of a gate-on voltage is supplied. For example, the second transistor M2 may be a switching transistor for transferring each data signal DS to the inside of the pixel PX.

A first electrode of the capacitor Cst may be connected to the first node N1, and the second electrode of the capacitor Cst may be connected to the second node N2. The capacitor Cst may charge a voltage corresponding to the data signal DS supplied to the first node N1 during each frame period.

The third transistor M3 may be connected between the second node N2 and the initialization power line INL. A gate electrode of the third transistor M3 may be connected to the control line SSL (or the scan line SL). The third transistor M3 may be turned on in case that the control signal SSC of the gate-on voltage is supplied from the control line SSL, and thus may transfer the voltage (or a reference voltage) of the initialization power VINT supplied to the initialization power line INL to the second node N2 or may transfer a voltage of the second node N2 to the initialization power line INL. The voltage of the second node N2 transferred to the initialization power line INL may be provided to a driving circuit (for example, a timing control unit or timing controller) via a sensing circuit, and may be used to compensate for variations in characteristics of the pixels PX.

In FIG. 3, all transistors M included in the pixel circuit PXC are illustrated as N-type transistors, but the disclosure is not limited thereto. For example, at least one of the first, second, and third transistors M1, M2, and M3 may be a P-type transistor. Also, the structure and driving method of the pixel circuit PXC and/or the pixel PX may be variously changed according to embodiments.

Referring to FIG. 4, the pixel PX may be connected to at least one scan line and data line. For example, in case that the pixel PX may be disposed in an i-th (i is a natural number) horizontal line (for example, i-th pixel row) and a j-th (j is a natural number) vertical line (for example, j-th pixel column) of the display area DA, the pixels PX may be connected to the i-th scan line Si (also referred to as "scan line Si" or "current scan line Si") and the j-th data line Dj (also referred to as "data line Dj") of the display area DA. In an embodiment, the pixel PX may be further connected to at least one other scan line and/or control line in addition to the scan line Si of the corresponding horizontal line. For example, the pixel PX disposed at the i-th horizontal line of the display area DA may be further connected to one of the scan lines of previous horizontal lines, for example, the i−1-th scan line Si−1 (also referred to as "previous scan line Si−1"), and/or one of the scan lines of the next horizontal lines, for example, the i+1-th scan line Si+1 (also referred to as "next scan line Si+1").

Also, the pixel PX may be connected to the first power VDD and the second power VSS through the first power line PL1 and the second power line PL2, respectively. In an embodiment, the pixel PX may be further connected to other power in addition to the first and second powers VDD and VSS. For example, the pixel PX may also be connected to the initialization power Vint.

The pixel circuit PXC may include transistors M and at least one capacitor Cst. For example, the pixel circuit PXC may include a first transistor M1', a second transistor M2', a third transistor M3', a fourth transistor M4, a fifth transistor M5, a sixth transistor M6, a seventh transistor M7, and a capacitor Cst.

The first transistor M1' may be connected between the first power VDD and the light-emitting unit EMU. For example, one electrode (for example, a source electrode) of the first transistor M1' may be connected to the first power VDD through the fifth transistor M5 and the first power line PL1, and another electrode (for example, a drain electrode) of the first transistor M1' may be connected to the light-emitting unit EMU (for example, an anode electrode of the light-emitting unit EMU) via the sixth transistor M6. A gate electrode of the first transistor M1' may be connected to the first node N1'. The first transistor M1' may control a driving current supplied to the light-emitting unit EMU in response to the voltage of the first node N1'.

In an embodiment, the first transistor M1' may further include a bottom metal layer BML. In an embodiment, the bottom metal layer BML may be connected to one electrode (for example, a source electrode) of the first transistor M1'.

The second transistor M2' may be connected between the data line Dj and one electrode (for example, a source electrode) of the first transistor M1'. A gate electrode of the second transistor M2' may be connected to the scan line Si. The second transistor M2' may be turned on in case that a scan signal SSi of a gate-on voltage (for example, a logic high voltage or a low level voltage) is supplied from the scan line Si to electrically connect the data line Dj to one electrode of the first transistor M1'. Accordingly, in case that the second transistor M2' is turned on, the data signal DSj supplied from the data line Dj may be transferred to the first transistor M1'.

The third transistor M3' may be connected between another electrode (for example, a drain electrode) of the first transistor M1' and the first node N1'. A gate electrode of the third transistor M3' may be connected to the scan line Si. The third transistor M3' may be turned on in case that the scan signal SSi of the gate-on voltage is supplied from the scan line Si to connect the first transistor M1' in a form of a diode. Accordingly, during the period in which the scan signal SSi of the gate-on voltage is supplied, the first transistor M1' may be turned on in a diode-connected form, and accordingly, the data signal DSj may be provided from the data line Dj sequentially via the second transistor M2', the first transistor M1', and the third transistor M3' to the first node N1'. Accordingly, the capacitor Cst may be charged with a voltage corresponding to the data signal DSj and the threshold voltage of the first transistor M1'.

The fourth transistor M4 may be connected between the first node N1' and the initialization power Vint. A gate electrode of the fourth transistor M4 may be connected to a previous scan line, for example, to an i–1-th scan line Si–1. In case that the scan signal SSi–1 of the gate-on voltage is supplied to the i–1-th scan line Si–1, the fourth transistor M4 may be turned on to transfer the voltage of the initialization power Vint to the first node N1'.

According to an embodiment, the voltage of the initialization power Vint may be less than or equal to the lowest voltage of the data signal DSj. Before the data signal DSj of the corresponding frame is supplied to each pixel PX, the first node N1' may be initialized with the voltage of the initialization power Vint by the scan signal SSi–1 of the gate-on voltage supplied to the i–1-th scan line Si–1. Accordingly, regardless of the voltage of the data signal DSj of the previous frame, the first transistor M1' may be connected in the form of the diode in the forward direction while the scan signal SSi of the gate-on voltage is supplied to the i-th scan line Si. Accordingly, the data signal DSj of the corresponding frame may be transferred to the first node N1'.

The fifth transistor M5 may be connected between the first power VDD and the first transistor M1'. A gate electrode of the fifth transistor M5 may be connected to a light-emitting control line of a corresponding horizontal line, for example, to an i-th light-emitting control line Ei (also referred to as "light-emitting control line Ei"). The fifth transistor M5 may be turned off in case that a light-emitting control signal ESi of a gate-off voltage (for example, a logic low voltage or a high level voltage) is supplied to the light-emitting control line Ei, and may be turned on in other cases.

The sixth transistor M6 may be connected between the first transistor M1' and the light-emitting unit EMU. A gate electrode of the sixth transistor M6 may be connected to the light-emitting control line Ei. The sixth transistor M6 may be turned off in case that the light-emitting control signal ESi of the gate-off voltage is supplied to the light-emitting control line Ei, and may be turned on in other cases.

The fifth and sixth transistors M5 and M6 may control the light-emitting period of the pixel PX. For example, in case that the fifth and sixth transistors M5 and M6 are turned on, a current path that a driving current can flow from the first power VDD, sequentially via the fifth transistor M5, the first transistor M1', the sixth transistor M6, and the light-emitting unit EMU to the second power VSS, may be formed. In in case that the fifth and/or sixth transistors M5 and M6 are turned off, the current path may be blocked and light-emitting of the pixel PX may be prevented.

The seventh transistor M7 may be connected between one electrode of the light-emitting unit EMU (for example, an anode electrode of the light-emitting unit EMU) and the initialization power Vint. A gate electrode of the seventh transistor M7 may be connected to a scan line for selecting the pixels PX of the next horizontal line, for example, the i+1-th scan line Si+1. The seventh transistor M7 may be turned on in case that the scan signal SSi+1 of the gate-on voltage is supplied to the i+1-th scan line Si+1 to supply the voltage of the initialization power Vint to one electrode of the light-emitting unit EMU. Accordingly, during each initialization period in which the voltage of the initialization power Vint is transferred to the light-emitting unit EMU, the voltage of one electrode of the light-emitting unit EMU may be initialized.

A control signal and/or the initialization power Vint for controlling the operation of the seventh transistor M7 may be variously changed. For example, in an embodiment, a gate electrode of the seventh transistor M7 may be connected to the scan line of the corresponding horizontal line, for example, the i-th scan line Si, or the gate electrode of the seventh transistor M7 may be connected to the scan line of the previous horizontal line, for example, the i–1-th scan line Si–1. The seventh transistor M7 may be turned on in case that the scan signal SSi or SSi–1 of the gate-on voltage is supplied to the i-th scan line Si or the i–1-th scan line Si–1 to supply the voltage of the initialization power Vint to one electrode of the light-emitting unit EMU. Accordingly, during each frame period, the pixel PX may emit light with a more uniform luminance in response to the data signal DSj. According to an embodiment, the fourth transistor M4 and the seventh transistor M7 may be connected to different initialization power having different potentials. For example, according to an embodiment, the pixel PX may be connected to initialization power, and the first node N1' and one electrode (for example, the anode electrode) of the light-emitting unit EMU may be initialized by the initialization power having different potentials.

The capacitor Cst may be connected between the first power VDD and the first node N1'. The capacitor Cst may store a voltage corresponding to a data signal DSj supplied to the first node N1' during each frame period and the threshold voltage of the first transistor M1'.

In FIG. 4, all transistors M included in the pixel circuit PXC are illustrated as P-type transistors, but the disclosure is not limited thereto. For example, at least one of the first transistor M1', the second transistor M2', the third transistor M3', the fourth transistor M4, the fifth transistor M5, the sixth transistor M6, and the seventh transistor M7 may be an N-type transistor. A gate-on voltage (for example, a logic high voltage) for turning on the N-type transistor may be a high level voltage.

The structure and driving method of the pixel PX may be variously changed according to embodiments. For example, the pixel circuit PXC and/or the pixel PX may have various structures in addition to the structures according to the embodiments of FIGS. 3 and 4. Interconnection structure and/or operation timing of the transistors M and/or the capacitor Cst may be variously changed according to embodiments. Further, the pixel PX may be constituted as a passive pixel not including the pixel circuit PXC, and the light-emitting unit EMU may be connected to or directly connected to at least one signal line and/or power line.

The light-emitting unit EMU may include at least one light-emitting element LD connected between the first power VDD and the second power VSS. The first power VDD and the second power VSS may supply voltages of different potentials. A potential difference between the first power VDD and the second power VSS may be greater than or equal to the threshold voltage of the light-emitting element LD.

In an embodiment, the light-emitting unit EMU may include a single light-emitting element LD connected in a forward direction between the pixel circuit PXC and the second power VSS, as in the embodiments of FIGS. 3 and 4. The anode electrode of the light-emitting element LD may be connected to the first power VDD through the pixel circuit PXC and/or the first power line PL1, and the cathode electrode of the light-emitting element LD may be connected to the second power VSS through the second power line PL2.

By way of example, the light-emitting unit EMU may include light-emitting elements LD connected in the forward direction between the first power VDD and the second power VSS. For example, the light-emitting unit EMU may include light-emitting elements LD that are connected in parallel between the pixel circuit PXC and the second power VSS, or are connected in series or in series-parallel between the pixel circuit PXC and the second power VSS.

In an embodiment, each light-emitting element LD may be an inorganic light-emitting diode manufactured by epitaxial growth. For example, the light-emitting unit EMU may include at least one inorganic light-emitting diode manufactured with a small size ranging from nanometers to micrometers using a nitride-based semiconductor. The type, structure, and/or number of light-emitting element(s) LD constituting the light-emitting unit EMU may be variously changed according to embodiments.

At least one light-emitting element LD connected in the forward direction between the first power VDD and the second power VSS may constitute an effective light source of each pixel PX. In case that a driving current is supplied to the light-emitting element LD of the pixel PX through the pixel circuit PXC of each pixel PX, the light-emitting element LD may emit light with luminance corresponding to the driving current. Accordingly, the pixel PX may emit light with luminance corresponding to the driving current.

Figure 5:
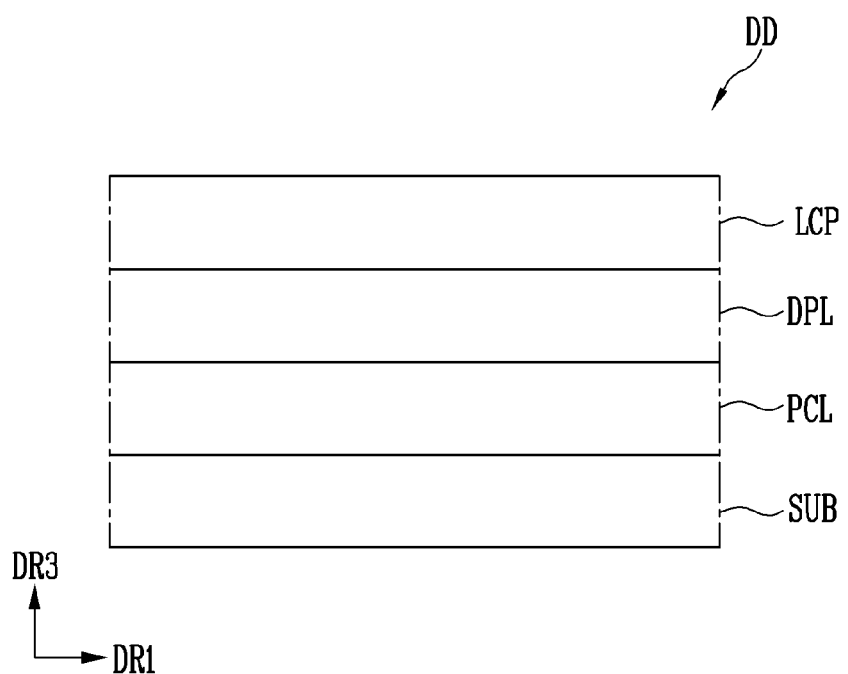
FIG. 5 is a schematic cross-sectional view illustrating schematically a display device according to an embodiment.

FIG. 5 is a schematic cross-sectional view illustrating schematically a display device according to an embodiment.

Referring to FIGS. 1 to 5, the display device DD may include a substrate SUB, a pixel circuit part PCL, a display element part DPL, and a light control part LCP. In an embodiment, the substrate SUB, the pixel circuit part PCL, the display element part DPL, and the light control part LCP may be sequentially arranged or disposed in the display direction (for example, the third direction DR3) of the display device DD.

The substrate SUB may constitute a base surface of the display device DD. Individual components of the display device DD may be disposed on the substrate SUB. For example, each of the pixels PX may be disposed in the pixel areas on the substrate SUB.

The pixel circuit part PCL may be disposed on the substrate SUB. The pixel circuit part PCL may include circuit elements constituting the pixel circuits PXC of the pixels PX, and lines connected to the circuit elements. For example, transistors M and capacitors Cst constituting the pixel circuit PXC of the pixel PX may be disposed in each pixel area of the pixel circuit part PCL. Also, signal lines and/or power lines connected to the pixels PX may be disposed inside and/or around the pixel areas. In an embodiment, in case that the pixels PX do not include the pixel circuits PXC, the pixel circuit part PCL may include only lines and/or pads for supplying at least one driving signal and/or driving power to the display element part DPL, or may be integrated with the display element part DPL.

The display element part DPL may be disposed on the pixel circuit part PCL. The display element part DPL may include light-emitting elements LD constituting the light-emitting units EMU of the pixels PX, and electrodes and/or lines connected to the light-emitting elements LD. For example, at least one light-emitting element LD constituting the light-emitting unit EMU of each pixel PX may be provided in each pixel area of the display element part DPL, for example, in the light-emitting area. At least one electrode and/or line connected to the at least one light-emitting element LD may be provided inside and/or around the light-emitting area.

In an embodiment, the light-emitting element LD provided to the light-emitting unit EMU of each pixel PX may be connected to the pixel circuit PXC of the corresponding pixel PX and at least one power line (for example, a second power line PL2). The light-emitting element LD may emit light with luminance corresponding to an electrical signal (for example, a driving current) provided from the pixel circuit PXC. Light generated by the light-emitting elements LD of the display element part DPL may pass through the light control part LCP and be emitted to the outside.

The light control part LCP may be disposed on the display element part DPL. In an embodiment, the light control part LCP may include color filters that selectively transmit light having a specific or given color and/or a wavelength corresponding thereto. For example, the light control part LCP may include a color filter of a first color disposed on the first pixel PX1 (hereinafter, referred to as a "first color filter"), a color filter of a second color disposed on the second pixel PX2 (hereinafter, referred to as a "second color filter"), and a color filter of a third color disposed on the third pixel PX3 (hereinafter, referred to as a "third color filter").

In an embodiment, the light control part LCP may further include additional components in addition to color filters. For example, the light control part LCP may selectively further include a light scattering layer including light scattering particles.

Figure 6:
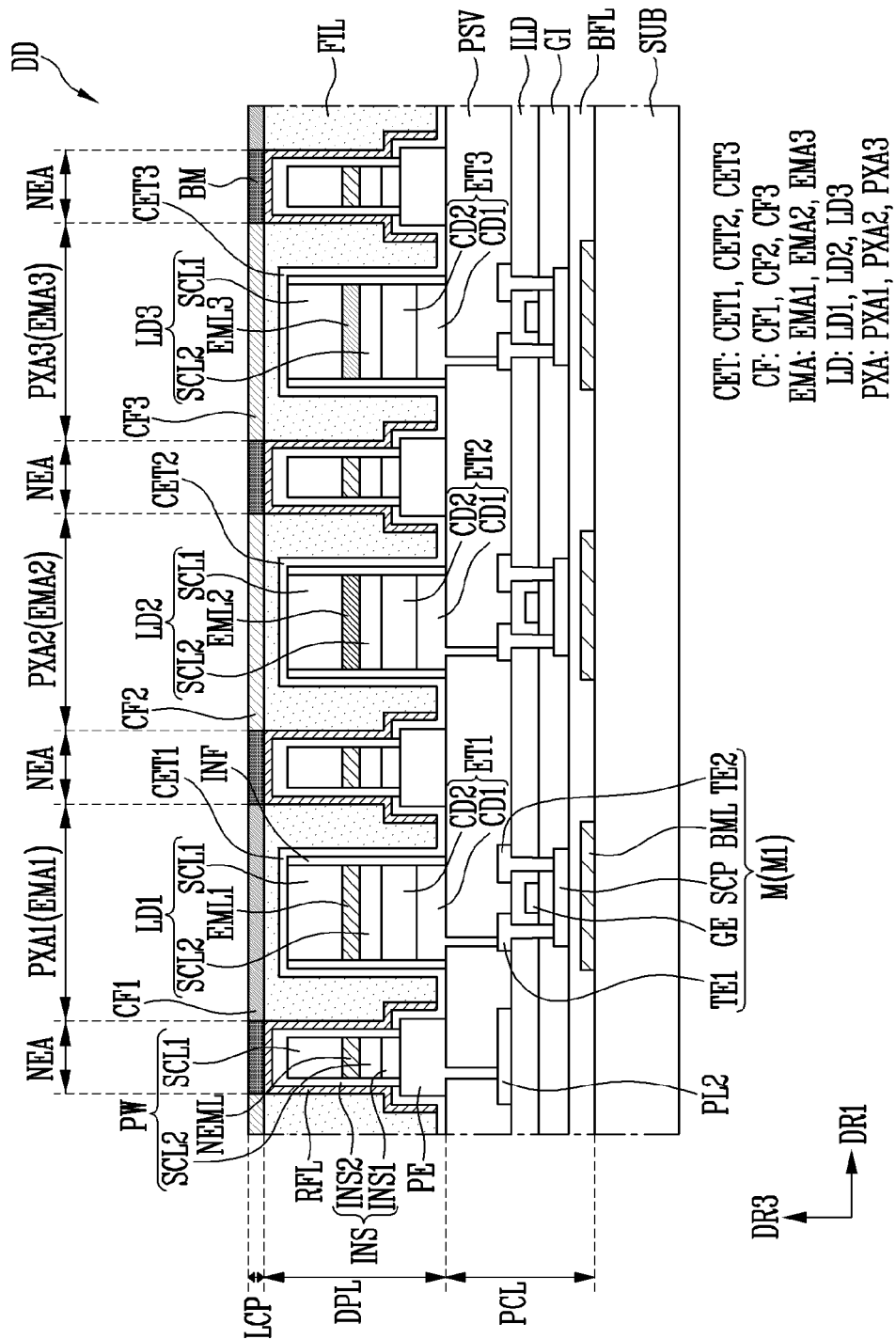
FIGS. 6 to 8 are schematic cross-sectional views illustrating a display device according to respective embodiments.
Figure 7:
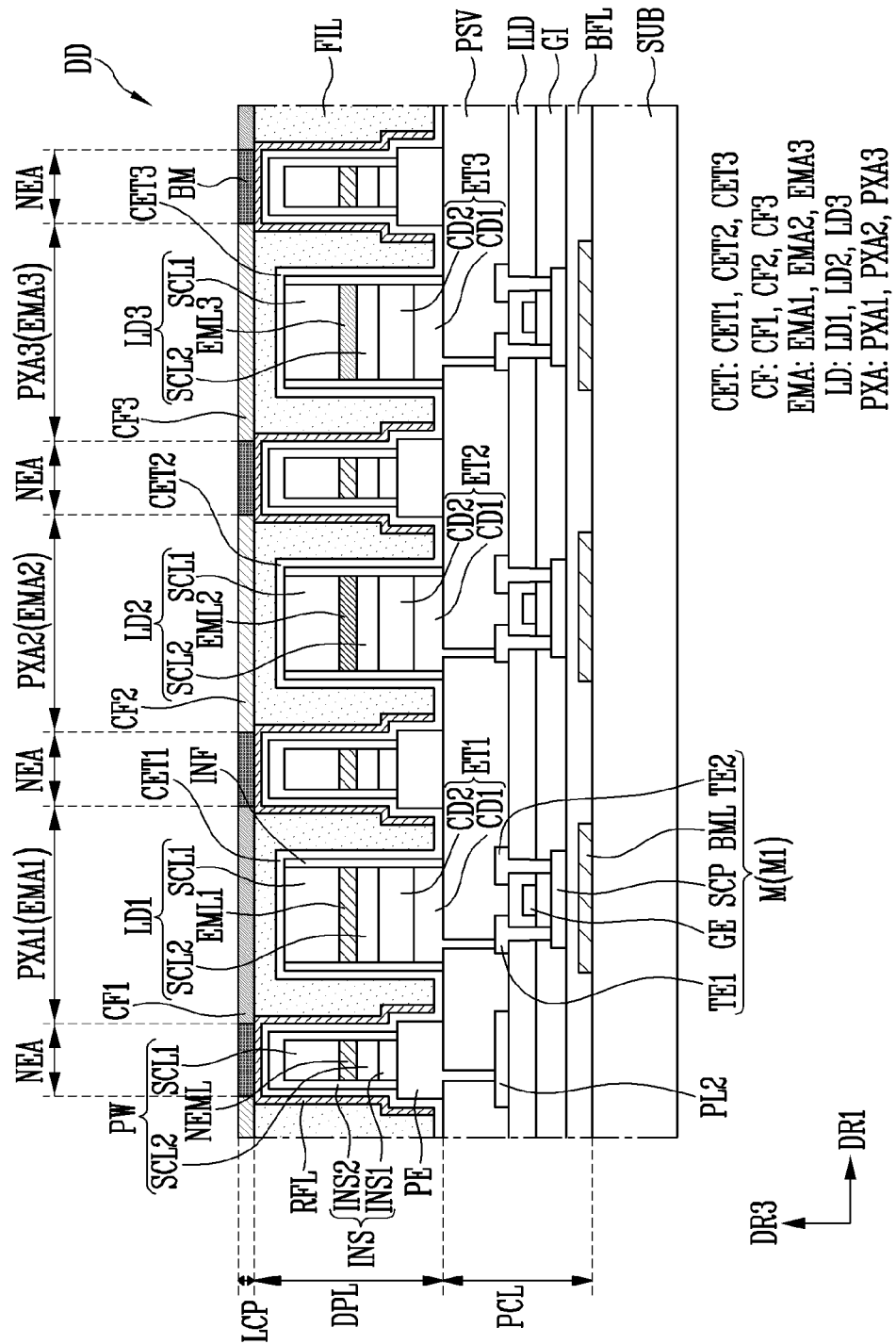
Figure 8:
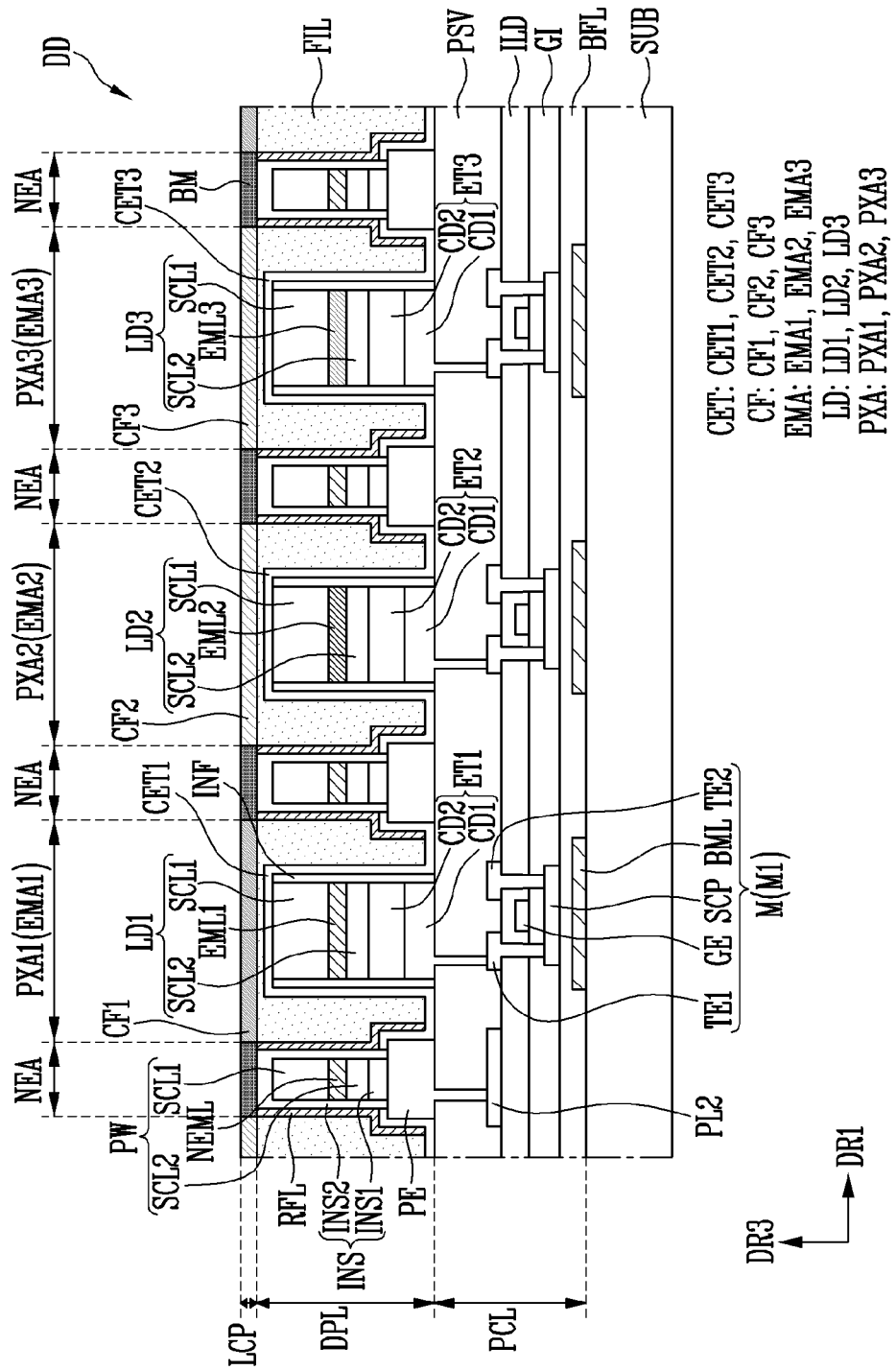

FIGS. 6 to 8 are schematic cross-sectional views illustrating a display device DD according to respective embodiments. In FIGS. 6 to 8, different embodiments of a cross section of the display device DD will be shown centering on any one pixel group PXG that may be disposed in the display area DA of FIGS. 1 and 2. For example, FIGS. 6 and 7 show different embodiments in relation to the common electrode CET provided to the display element part DPL, and FIGS. 6 and 8 show different embodiments in relation to a reflective layer RFL disposed on the partition wall PW.

In FIGS. 6 to 8, as examples of circuit elements that may be provided in each pixel area PXA of the pixel circuit part PCL, any one transistor M (for example, the first transistor M1 including the bottom metal layer BML) connected to each light-emitting element LD will be illustrated.

In FIGS. 6 to 8, a second power line PL2 will be illustrated as examples of lines that may be provided to the pixel circuit part PCL. In an embodiment, the second power line PL2 may be connected to the light-emitting elements LD of the display element part DPL through at least one pad electrode PE, but is not limited thereto. In an embodiment, the second power line PL2 may be connected to the light-emitting elements LD of the display element part DPL inside the display area DA, but is not limited thereto. For example, the second power line PL2 may be connected to the light-emitting elements LD of the display element part DPL in the non-display area NA.

For convenience, in FIGS. 6 to 8, the pixel area PXA in which the pixel PX may be disposed will be displayed centering on the light-emitting area EMA of each pixel PX. However, each pixel area PXA may include a pixel circuit area in which circuit elements constituting each pixel circuit PXC are disposed, and a light-emitting area EMA in which at least one light-emitting element LD constituting each light-emitting unit EMU are disposed. For example, the first pixel area PXA1 in which the first pixel PX1 may be disposed may include at least a first light-emitting area EMA1, and may selectively further include a part of a non-light-emitting area NEA disposed around the first light-emitting area EMA1. Similarly, the second pixel area PXA2 in which the second pixel PX2 may be disposed may include at least a second light-emitting area EMA2, and may selectively further include a part of the non-light-emitting area NEA disposed around the second light-emitting area EMA2. The third pixel area PXA3 in which the third pixel PX3 may be disposed may include at least a third light-emitting area EMA3, and may selectively further include the non-light-emitting area NEA disposed around the third light-emitting area EMA3. In an embodiment, the light-emitting area EMA of each pixel PX may overlap the pixel circuit area of the pixel PX, but is not limited thereto.

Referring to FIGS. 1 to 8, the display device DD may include the substrate SUB, and the pixel circuit part PCL, the display element part DPL, and the light control part LCP sequentially disposed on the substrate SUB.

The substrate SUB may be a rigid substrate, or a flexible substrate or film, and the material or structure thereof is not particularly limited. For example, the substrate SUB may be an insulating substrate or an insulating film such as a glass substrate or a polymer film, and may be a single-layered or multi-layered substrate or film.

The pixel circuit part PCL may be provided on one surface or a surface of the substrate SUB. The pixel circuit part PCL may include circuit elements constituting each pixel PX. For example, transistors M and capacitors Cst constituting the pixel circuit PXC of the pixel PX may be formed in each pixel area PXA of the pixel circuit part PCL.

Also, the pixel circuit part PCL may include various signal lines and power lines connected to the pixels PX. For example, the pixel circuit part PCL may include the scan lines SL (or Si−1, Si, Si+1), the control lines SSL, the light-emitting control lines Ei, the data lines DL (or Dj), the initialization power line INL, and/or the first and second power lines PL1 and PL2.

The pixel circuit part PCL may include insulating layers. For example, the pixel circuit part PCL may include a buffer layer BFL, a gate insulating layer GI, an interlayer insulating layer ILD, and/or a passivation layer PSV sequentially disposed on one surface or a surface of the substrate SUB.

The pixel circuit part PCL may be disposed on the substrate SUB, and may include a first conductive layer including the bottom metal layer BML of the first transistor M1. For example, the first conductive layer may be disposed between the substrate SUB and the buffer layer BFL, and may include bottom metal layers BML of the first transistors M1 included in the pixels PX.

The first conductive layer may further include at least one line and/or bridge pattern. For example, the first conductive layer may include at least some or a number of lines extending in the second direction DR2 (or the first direction DR1) in the display area DA. For example, the first conductive layer may include a first power line PL1, an initialization power line INL, and/or data lines DL or Dj.

The buffer layer BFL may be disposed on one surface or a surface of the substrate SUB including the first conductive layer. The buffer layer BFL may prevent an impurity from diffusing into each circuit element.

The semiconductor layer may be disposed on the buffer layer BFL. The semiconductor layer may include semiconductor patterns SCP of the transistors M. Each semiconductor pattern SCP may have a channel region overlapping the gate electrode GE of the corresponding transistor M, and first and second conductive regions (for example, source and drain regions) disposed at both sides of the channel region. Each semiconductor pattern SCP may be a semiconductor pattern made of polysilicon, amorphous silicon, or oxide semiconductor.

The gate insulating layer GI may be disposed on the semiconductor layer. A second conductive layer may be disposed on the gate insulating layer GI.

The second conductive layer may include gate electrodes GE of the transistors M. The second conductive layer may further include one electrode of the capacitors Cst and/or a bridge pattern. In case that at least one power line and/or signal line disposed in the display area DA is formed of multiple layers, the second conductive layer may further include at least one conductive pattern constituting the at least one power line and/or signal line.

The interlayer insulating layer ILD may be disposed on the second conductive layer. A third conductive layer may be disposed on the interlayer insulating layer ILD.

The third conductive layer may include source electrodes TE1 and drain electrodes TE2 of the transistors M. Each source electrode TE1 (also referred to as a "first transistor electrode") may be connected to one region (for example, a source region) of the semiconductor pattern SCP included in the corresponding transistor M through a contact hole or the like, and each drain electrode TE2 (also referred to as a "second transistor electrode") may be connected to another region (for example, a drain region) of the semiconductor pattern SCP included in the corresponding transistor M through a different contact hole.

In embodiments of FIGS. 6 to 8, an embodiment in which the source electrodes TE1 and the drain electrodes TE2 of the transistors M are formed separately from each of semiconductor patterns SCP is disclosed, but the disclosure is not limited thereto. For example, in an embodiment, the source electrode TE1 and/or the drain electrode TE2 of at least one transistor M may be integrally formed with the semiconductor pattern SCP. For example, each of the source electrode TE1 and the drain electrode TE2 may be formed by doping different regions of the semiconductor pattern SCP at a high concentration.

The third conductive layer may further include one electrode of each capacitor Cst, at least one line, and/or a bridge pattern. For example, the third conductive layer may include at least some or a number of lines extending in the first direction DR1 (or the second direction DR2) in the display area DA. For example, the third conductive layer may include scan lines SL (or Si−1, Si, Si+1), control lines SSL, light-emitting control lines Ei, and/or second power line PL2. In case that at least one power line and/or signal line disposed in the display area DA is formed of multiple layers, the third conductive layer may further include at least one conductive pattern constituting the at least one power line and/or signal line.

Each of the conductive patterns, electrodes, and/or line constituting the first to third conductive layers may have conductivity by including at least one conductive material, and the constituent material thereof is not particularly limited. For example, each of conductive patterns, electrodes, and/or lines constituting the first to third conductive layers may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu), and may include various types of conductive materials. Each of the conductive patterns, electrodes and/or lines constituting the first to third conductive layers may be provided as a single layer or multiple layers, and the cross-sectional structure thereof is not particularly limited.

The passivation layer PSV may be disposed on the third conductive layer. Each of the buffer layer BFL, the gate insulating layer GI, the interlayer insulating layer ILD, and the passivation layer PSV may be composed of a single layer or multiple layers, and may include at least one inorganic insulating material and/or an organic insulating material. For example, each of the buffer layer BFL, the gate insulating layer GI, the interlayer insulating layer ILD, and the passivation layer PSV may include various types of organic/inorganic insulating materials including silicon nitride ($SiN_x$), silicon oxide ($SiO_x$), silicon oxynitride ($SiO_xN_y$), or the like within the spirit and the scope of the disclosure. In an embodiment, the passivation layer PSV may include an organic insulating layer, and may planarize a surface of the pixel circuit part PCL.

The display element part DPL may be disposed on the passivation layer PSV.

The display element part DPL may include light-emitting units EMU of the pixels PX. For example, in each pixel area PXA of the display element part DPL, at least one light-emitting element LD constituting the light-emitting unit EMU of the pixel PX, and electrodes connected to the light-emitting element LD may be disposed.

The display element part DPL may include at least one first light-emitting element LD1 disposed in the light-emitting area (hereinafter, referred to as a "first light-emitting area EMA1") of the first pixel PX1, at least one second light-emitting element LD2 disposed in the light-emitting area (hereinafter, referred to as a "second light-emitting area EMA2") of the second pixel PX2, and at least one third light-emitting element LD3 disposed in the light-emitting area (hereinafter, referred to as a "third light-emitting area EMA3") of the third pixel PX3. The display element part DPL may include the first electrode ET1 and the fourth electrode CET1 that may be disposed in the first light-emitting area EMA1 and connected to the first light-emitting element LD1, the second electrode ET2 and the fifth electrode CET2 that may be disposed in the second light-emitting area EMA2 and connected to the second light-emitting element LD2, the third electrode ET3 and the sixth electrode CET3 that may be disposed in the third light-emitting area EMA3 and connected to the third light-emitting element LD3, at least one pad electrode PE connected to the fourth, fifth and sixth electrodes CET1, CET2, and CET3, and a partition wall PW disposed on the pad electrode PE, and a filler FIL formed (for example, filled) in the light-emitting areas EMA.

The first electrode ET1, the second electrode ET2, and the third electrode ET3 may be disposed on the pixel circuit part PCL to be respectively disposed in the first light-emitting area EMA1, the second light-emitting area EMA2, and the third light-emitting area EMA3. In an embodiment, the first electrode ET1, the second electrode ET2, and the third electrode ET3 may be anode electrodes of the first pixel PX1, the second pixel PX2, and the third pixel PX3, respectively, and may be separated from each other.

The first electrode ET1 may be electrically connected to at least one circuit element constituting the pixel circuit PXC of the first pixel PX1. For example, the first electrode ET1 may be electrically connected to the first transistor M1 of the first pixel PX1.

The second electrode ET2 may be electrically connected to at least one circuit element constituting the pixel circuit PXC of the second pixel PX2. For example, the second electrode ET2 may be electrically connected to the first transistor M1 of the second pixel PX2.

The third electrode ET3 may be electrically connected to at least one circuit element constituting the pixel circuit PXC of the third pixel PX3. For example, the third electrode ET3 may be electrically connected to the first transistor M1 of the third pixel PX3.

The first electrode ET1, the second electrode ET2, and the third electrode ET3 may be electrically connected to the second semiconductor layers SCL2 of the first light-emitting element LD1, the second light-emitting element LD2, and the third light-emitting element LD3, respectively. In case that the first electrode ET1, the second electrode ET2, and the third electrode ET3 are the anode electrodes of the first pixel PX1, the second pixel PX2, and the third pixel PX3, respectively, the second semiconductor layers SCL2 of the first light-emitting element LD1, the second light-emitting element LD2, and the third light-emitting element LD3 may be P-type semiconductor layers.

Each of the first electrode ET1, the second electrode ET2, and the third electrode ET3 may have conductivity by including at least one conductive material, and the constituent material thereof is not particularly limited. Each of the first electrode ET1, the second electrode ET2, and the third electrode ET3 may be composed of a single layer or multiple layers, and the shape and/or structure thereof is not particularly limited. For example, each of the first electrode ET1, the second electrode ET2, and the third electrode ET3 may be composed of multiple layers including a first conductive pattern CD1 and a second conductive pattern CD2 that may be sequentially disposed on the pixel circuit part PCL, but is not limited thereto.

In an embodiment, each of the first electrode ET1, the second electrode ET2, and the third electrode ET3 may include a reflective conductive layer. For example, at least one of the first conductive pattern CD1 and the second conductive pattern CD2 may include at least one metal layer including at least one of various metal materials including a metal having a high reflectance in a visible light wavelength band, for example, aluminum (Al), gold (Au), and silver (Ag). Accordingly, it is possible to increase light efficiency (for example, a light-emitting rate of light generated by each light-emitting element LD) of the pixels PX.

The pad electrodes PE may be disposed in the non-light-emitting area NEA, and may be electrically connected to each other. The pad electrodes PE may be electrically connected to the second power line PL2 provided to the pixel circuit part PCL, and may be electrically connected to the fourth, fifth, and sixth electrodes CET1, CET2, and CET3 (or, a common electrode CET formed by the fourth, fifth, and sixth electrodes CET1, CET2, and CET3) provided to the display element part DPL. For example, the pad electrodes PE may be connection electrodes for connecting the second power line PL2 of the pixel circuit part PCL and the common electrode CET of the display element part DPL.

In an embodiment, the pad electrodes PE may be formed to be connected to each other in a shape similar to the partition wall PW in a plan view, so that they may form one integrated pad electrode. The pad electrodes PE may be considered as physically and/or electrically one pad electrode. By way of example, the pad electrodes PE may be formed to be separated from each other, and may be electrically connected to each other through the second power line PL2 and/or the fourth, fifth and sixth electrodes CET1, CET2, and CET3.

At least one of the pad electrodes PE may be connected to the second power line PL2. For example, a portion of the second power line PL2 may be disposed under or below each of the pad electrodes PE, and each of the pad electrodes PE may be connected to the second power line PL2. By way of example, a portion of the second power line PL2 may be disposed under or below at least one of the pad electrodes PE, and the at least one pad electrode PE may be connected to the second power line PL2. The other pad electrodes PE may be integrally connected to the at least one pad electrode PE, or may be connected to the at least one pad electrode PE by the fourth, fifth, and sixth electrodes CET1, CET2, CET3, or the like, and thus it may be connected to the second power line PL2. Also, the pad electrodes PE may be connected to the second power line PL2 inside and/or outside the display area DA. Accordingly, the pad electrodes PE may be commonly connected to the second power line PL2.

The pad electrodes PE may have conductivity by including at least one conductive material, and the constituent material thereof is not particularly limited. The pad electrodes PE may be composed of a single layer or multiple layers, and the shape and/or structure thereof is not particularly limited.

In an embodiment, the pad electrodes PE may be formed simultaneously with the first electrode ET1, the second electrode ET2, and the third electrode ET3 in a process of forming the first electrode ET1, the second electrode ET2, and the third electrode ET3. For example, the pad electrodes PE may be formed simultaneously with the second conductive patterns CD2 in a process of forming the second conductive patterns CD2 of the first electrode ET1, the second electrode ET2, and the third electrode ET3. The pad electrodes PE may include the same conductive material as the second conductive patterns CD2.

The pad electrodes PE may have the same or different structure from the first electrode ET1, the second electrode ET2, and the third electrode ET3. For example, the pad electrodes PE may be single-layered electrodes that may include the same material or similar material as the first conductive patterns CD1 or the second conductive patterns CD2 of the first electrode ET1, the second electrode ET2, and the third electrode ET3, and that are simultaneously formed with the first conductive patterns CD1 or the second conductive patterns CD2. By way of example, the pad electrodes PE may be multi-layered electrodes that are simultaneously formed with the first conductive patterns CD1 and the second conductive patterns CD2 by using the same material or similar material as the first conductive patterns CD1 and the second conductive patterns CD2 of the first electrode ET1, the second electrode ET2, and the third electrode ET3. For example, the pad electrodes PE may have substantially the same stack structure as the first electrode ET1, the second electrode ET2, and the third electrode ET3.

A first light-emitting element LD1, a second light-emitting element LD2, and a third light-emitting element LD3 may be disposed on the first electrode ET1, the second electrode ET2, and the third electrode ET3, respectively.

The first light-emitting element LD1 may be disposed on the first electrode ET1 to be electrically connected to the first electrode ET1. The first light-emitting element LD1 may include a light-emitting stack including a second semiconductor layer SCL2, a first light-emitting layer EML1, and a first semiconductor layer SCL1 sequentially disposed on the first electrode ET1.

The second light-emitting element LD2 may be disposed on the second electrode ET2 to be electrically connected to the second electrode ET2. The second light-emitting element LD2 may include a light-emitting stack including the second semiconductor layer SCL2, a second light-emitting layer EML2, and the first semiconductor layer SCL1 sequentially disposed on the second electrode ET2.

The third light-emitting element LD3 may be disposed on the third electrode ET3 to be electrically connected to the third electrode ET3. The third light-emitting element LD3 may include a light-emitting stack including the second semiconductor layer SCL2, a third light-emitting layer EML3, and the first semiconductor layer SCL1 sequentially disposed on the third electrode ET3.

The first semiconductor layers SCL1 of the first, second, and third light-emitting elements LD1, LD2, and LD3 may be electrically connected to the fourth electrode CET1, the fifth electrode CET2, and the sixth electrode CET3, respectively. In case that the fourth electrode CET1, the fifth electrode CET2, and the sixth electrode CET3 constitutes one common electrode CET, the first semiconductor layers SCL1 of the first, second, and third light-emitting elements LD1, LD2, and LD3 may be commonly connected to the common electrode CET.

The first semiconductor layers SCL1 of the first, second, and third light-emitting elements LD1, LD2, and LD3 may be semiconductor layers of a first conductive type. For example, each of the first semiconductor layers SCL1 of the first, second, and third light-emitting elements LD1, LD2, and LD3 may be an N-type semiconductor layer including an N-type dopant. For example, the first semiconductor layers SCL1 of the first, second, and third light-emitting elements LD1, LD2, and LD3 may include nitride-based semiconductor materials, such as InAlGaN, GaN, AlGaN, InGaN, AlN, and InN, and may be N-type semiconductor layers doped with a dopant such as Si, Ge, and Sn. However, the material constituting the first semiconductor layers SCL1 of the first, second, and third light-emitting elements LD1, LD2, and LD3 is not limited thereto, and various materials may constitute the first semiconductor layers SCL1 of the first, second, and third light-emitting elements LD1, LD2, and LD3.

The second semiconductor layers SCL2 of the first, second, and third light-emitting elements LD1, LD2, and LD3 may be electrically connected to the first electrode ET1, the second electrode ET2, and the third electrode ET3, respectively. For example, the second semiconductor layers SCL2 of the first, second, and third light-emitting elements LD1, LD2, and LD3 may be disposed on or directly disposed and/or connected on the first electrode ET1, the second electrode ET2, and the third electrode ET3, respectively, and thus they may be electrically connected to the first electrode ET1, the second electrode ET2, and the third electrode ET3. The disclosure, however, is not limited thereto. For example, in an embodiment, between the second semiconductor layers SCL2 of the first, second, and third light-emitting elements LD1, LD2, and LD3, and the first electrode ET1, the second electrode ET2, and the third electrode ET3, at least one electrode layer may be provided, respectively.

The second semiconductor layers SCL2 of the first, second, and third light-emitting elements LD1, LD2, and LD3 may be semiconductor layers of a second conductive type different from the first semiconductor layers SCL1 of the first, second, and third light-emitting elements LD1, LD2, and LD3. For example, each of the second semiconductor layers SCL2 of the first, second, and third light-emitting elements LD1, LD2, and LD3 may be a P-type semiconductor layer including a P-type dopant. For example, each of the second semiconductor layers SCL2 of the first, second, and third light-emitting elements LD1, LD2, LD3 may include nitride-based semiconductor materials, such as InAlGaN, GaN, AlGaN, InGaN, AlN, and InN, and may be P-type semiconductor layers doped with a dopant such as Mg. However, the material constituting the second semiconductor layers SCL2 of the first, second, and third light-emitting elements LD1, LD2, and LD3 is not limited thereto, and various materials may constitute the second semiconductor layers SCL2 of the first, second, and third light-emitting elements LD1, LD2, and LD3.

In an embodiment, the first semiconductor layer SCL1 and the second semiconductor layer SCL2 of each of the first, second, and third light-emitting elements LD1, LD2, and LD3 may have different thicknesses. For example, in the third direction DR3, each of the first semiconductor layers SCL1 may have a thickness greater than each of the second semiconductor layers SCL2.

Each of the first light-emitting layer EML1, the second light-emitting layer EML2, and the third light-emitting layer EML3 may be formed in a single-quantum well or a multi-quantum well structure. In an embodiment, the first light-emitting layer EML1, the second light-emitting layer EML2, and the third light-emitting layer EML3 may emit light having a wavelength in a range of about 400 nm to about 900 nm, and may have a double hetero-structure. In an embodiment, at least one material of GaN, InGaN, AlGaN, AlInGaN, AlGaInP, and AlGaInPAs may be used to form each of the first light-emitting layer EML1, the second light-emitting layer EML2, and the third light-emitting layer EML3. Various materials may be used to form the first light-emitting layer EML1, the second light-emitting layer EML2, and the third light-emitting layer EML3.

In an embodiment, a cladding layer (not shown) doped with a conductive dopant may be provided on and/or under or below each of the first light-emitting layer EML1, the second light-emitting layer EML2, and the third light-emitting layer EML3. The cladding layer may be formed of an AlGaN layer or an InAlGaN layer, but is not limited thereto.

Each of the first light-emitting layer EML1, the second light-emitting layer EML2, and the third light-emitting layer EML3 may be a layer in which light is generated by carrier recombination. For example, in case that a voltage higher than the threshold voltage is applied to both ends of each light-emitting element LD (for example, the first light-emitting element LD1, the second light-emitting element LD2, or the third light-emitting element LD3), the light-emitting element LD may emit light as electron-hole pairs are recombined in a light-emitting layer (for example, the first light-emitting layer EML1, the second light-emitting layer EML2, or the third light-emitting layer EML3) of the light-emitting element LD.

At least two of the first light-emitting layer EML1, the second light-emitting layer EML2, and the third light-emitting layer EML3 may emit light of different colors. For example, the first light-emitting layer EML1, the second light-emitting layer EML2, and the third light-emitting layer EML3 may be light-emitting layers that emit light of a first color, a second color, and a third color, respectively. In an embodiment, in case that the first pixel PX1, the second pixel PX2, and the third pixel PX3 are blue, green, and red pixels, respectively, the first light-emitting layer EML1, the second light-emitting layer EML2, and the third light-emitting layer EML3 may be light-emitting layers that emit blue, green, and red light, respectively.

In an embodiment, the first light-emitting layer EML1, the second light-emitting layer EML2, and the third light-emitting layer EML3 may include the same at least one nitride-based semiconductor material, but may have different composition ratios for at least one constituent material. For example, the first light-emitting layer EML1, the second light-emitting layer EML2, and the third light-emitting layer EML3 may include the same nitride-based semiconductor material, and each thereof may be composed of multiple layers. For example, each of the first light-emitting layer EML1, the second light-emitting layer EML2, and the third light-emitting layer EML3 may be composed of multiple layers including a GaN layer and an InGaN layer that are alternately and/or repeatedly stacked with each other, and the composition ratio of indium (In) included in the InGaN layer of the first light-emitting layer EML1, the second light-emitting layer EML2, and the third light-emitting layer EML3 may be different from each other. Accordingly, the first light-emitting layer EML1, the second light-emitting layer EML2, and the third light-emitting layer EML3 may emit light of different colors. For example, the first light-emitting layer EML1, the second light-emitting layer EML2, and the third light-emitting layer EML3 may include a nitride layer including elements such as indium (In) and gallium (Ga), and the first light-emitting layer, and by controlling molar concentration of indium (In) in the step of forming the first light-emitting layer EML1, the second light-emitting layer EML2, and the third light-emitting layer EML3, light-emitting wavelength of light generated in each of the first light-emitting layer EML1, the second light-emitting layer EML2, and the third light-emitting layer EML3 may be controlled.

An insulating film INF may be provided on side surfaces of each of the first, second, and third light-emitting elements LD1, LD2, and LD3. The insulating film INF can reduce or prevent surface defects of each of the first, second, and third light-emitting elements LD1, LD2, and LD3, and can prevent short defects through each of the first, second, and third light-emitting elements LD1, LD2, and LD3.

The insulating film INF may at least partially expose upper surfaces of each of the first, second, and third light-emitting elements LD1, LD2, and LD3. For example, the insulating film INF may expose upper surfaces of the first semiconductor layers SCL1 of each of the first, second, and third light-emitting elements LD1, LD2, and LD3.

The insulating film INF may include a transparent insulating material. Accordingly, light generated from the first, second, and third light-emitting layers EML1, EML2, and EML3 may pass through the insulating film INF and be emitted to the outside of the light-emitting element LD. For example, the insulating film INF may include at least one insulating material of $SiO_2$ or silicon oxide ($SiO_x$) not determined therein, $Si_3N_4$ or silicon nitride ($SiN_x$) not determined therein, $Al_2O_3$ or aluminum oxide ($Al_xO_y$) not determined therein, $TiO_2$ or titanium oxide ($Ti_xO_y$) not determined therein, and hafnium oxide ($HfO_x$), but is not limited thereto. The insulating film INF may be composed of a single layer or multiple layers.

A fourth electrode CET1, a fifth electrode CET2, and a sixth electrode CET3 may be disposed on the first light-emitting element LD1, the second light-emitting element LD2, and the third light-emitting element LD3, respectively. The fourth electrode CET1, the fifth electrode CET2, and the sixth electrode CET3 may be electrically connected to the first semiconductor layers SCL1 of the first, second, and third light-emitting elements LD1, LD2, and LD3. For example, the fourth electrode CET1, the fifth electrode CET2, and the sixth electrode CET3 may be disposed on the first light-emitting element LD1, the second light-emitting element LD2, and the third light-emitting element LD3, respectively, so as to be connected to the first semiconductor layers SCL1 of the first light-emitting element LD1, the second light-emitting element LD2, and the third light-emitting element LD3. The fourth electrode CET1, the fifth electrode CET2, and the sixth electrode CET3 may be electrically connected to the pad electrodes PE. For example, the fourth electrode CET1, the fifth electrode CET2, and the sixth electrode CET3 may be disposed on at least side surfaces of the pad electrodes PE to be connected to or directly connected to the pad electrodes PE.

The fourth electrode CET1, the fifth electrode CET2, and the sixth electrode CET3 may be integrally or non-integrally connected to each other. For example, the fourth electrode CET1, the fifth electrode CET2, and the sixth electrode CET3 may be are cathode electrodes of the first pixel PX1, the second pixel PX2, and the third pixel PX3, respectively, and may be electrically connected to each other.

For example, the fourth electrode CET1, the fifth electrode CET2, and the sixth electrode CET3 may be patterned to be separated from each other as in the embodiment of FIG. 6, but may be electrically connected to each other through the pad electrodes PE disposed under or below the partition wall PW and/or the second power line PL2 to form one common electrode CET. By way of example, the fourth electrode CET1, the fifth electrode CET2, and the sixth electrode CET3 may be entirely formed on the display element part DPL so as to be connected to each other as in the embodiment of FIG. 7. The fourth electrode CET1, the fifth electrode CET2, and the sixth electrode CET3 may physically and electrically constitute one common electrode CET.

In an embodiment formed of a structure the pixels PX share the anode electrode, the first electrode ET1, the second electrode ET2, and the third electrode ET3 may be separated from each other as cathode electrodes of the first pixel PX1, the second pixel PX2, and the third pixel PX3, respectively, and the fourth electrode CET1, the fifth electrode CET2, and the sixth electrode CET3 may be connected to each other as anode electrodes of the first, second, and third pixels PX1, PX2, and PX3, respectively. The first semiconductor layers SCL1 of the first, second, and third light-emitting elements LD1, LD2, and LD3 may be P-type semiconductor layers, and the second semiconductor layers SCL2 of the first, second, and third light-emitting elements LD1, LD2, and LD3 may be N-type semiconductor layers.

The fourth electrode CET1, the fifth electrode CET2, and the sixth electrode CET3 (or the common electrode CET) may have conductivity by including at least one conductive material. In an embodiment, the fourth electrode CET1, the fifth electrode CET2, and the sixth electrode CET3 may include a transparent conductive material. For example, the fourth electrode CET1, the fifth electrode CET2, and the sixth electrode CET3 may include at least one transparent electrode layer including a transparent conductive material such as indium tin oxide (ITO), indium zinc oxide (IZO), indium tin zinc oxide (ITZO), zinc oxide (ZnO) or indium oxide ($In_xO_y$), and may be substantially transparent. Accordingly, it is possible to increase the light-emitting efficiency (for example, front light-emitting rate) of light generated from each light-emitting element LD. The fourth electrode CET1, the fifth electrode CET2, and the sixth electrode CET3 may be composed of a single layer or multiple layers, and the shape, structure, and/or size thereof are not particularly limited.

The partition wall PW may be disposed on the pad electrodes PE. The partition wall PW may be disposed between the pixels PX. For example, the partition wall PW may be disposed in the non-light-emitting area NEA to surround the light-emitting areas EMA of the pixels PX.

In an embodiment, the partition wall PW may be formed simultaneously with the at least one light-emitting element LD by using the same material or similar material as the at least one light-emitting element LD. The partition wall PW may have the same stacked structure as the at least one light-emitting element LD.

For example, the partition wall PW may be formed simultaneously with the first light-emitting element LD1, and may include the same material or similar material and stacked structure as the first light-emitting element LD1. As an example, the partition wall PW may include a second semiconductor layer SCL2, an inactive light-emitting layer NEML, and a first semiconductor layer SCL1 sequentially disposed on the pad electrodes PE, and may include a light-emitting stack having a stacked structure substantially the same as the first light-emitting element LD1.

The first semiconductor layer SCL1 of the partition wall PW may be formed simultaneously with the first semiconductor layer SCL1 of the first light-emitting element LD1. The first semiconductor layer SCL1 of the partition wall PW may be formed of the same material or similar material and/or stacked structure as the first semiconductor layer SCL1 of the first light-emitting element LD1.

The second semiconductor layer SCL2 of the partition wall PW may be formed simultaneously with the second semiconductor layer SCL2 of the first light-emitting element LD1. The second semiconductor layer SCL2 of the partition wall PW may be formed of the same material or similar material and/or stacked structure as the second semiconductor layer SCL2 of the first light-emitting element LD1.

The inactive light-emitting layer NEML of the partition wall PW may be formed simultaneously as the first light-emitting layer EML1 of the first light-emitting element LD1. The inactive light-emitting layer NEML of the partition wall PW may be formed of the same material or similar material and/or stacked structure as the first light-emitting layer EML1 of the first light-emitting element LD1. For example, the inactive light-emitting layer NEML of the partition wall PW may include the same nitride-based semiconductor material as the first light-emitting layer EML1 of the first light-emitting element LD1, and may be composed of multiple layers having the same stacked structure as the first light-emitting layer EML1 of the first light-emitting element LD1.

In an embodiment, the first, second, and third light-emitting elements LD1, LD2, LD3 and the partition wall PW may be manufactured on one manufacturing substrate, and may be formed to have substantially the same height as each other. The first, second, and third light-emitting elements LD1, LD2, and LD3 and the partition wall PW may be provided at substantially the same height with respect to the substrate SUB.

The partition wall PW may be electrically isolated by an insulator INS provided on a surface thereof. Accordingly, the partition wall PW may be an inactive light-emitting element including a light-emitting stack but deactivated by blocking an electrical signal.

The insulator INS may include a first insulator INS1 and a second insulator INS2. The first insulator INS1 may be disposed between the partition wall PW and the pad electrodes PE to electrically separate the partition wall PW from the pad electrodes PE. The second insulator INS2 may be disposed on the remaining surface of the partition wall PW, for example, a side surface and an upper surface of the partition wall PW. The partition wall PW may be electrically isolated or floated by the first insulator INS1 and the second insulator INS2.

The disclosure, however, is not limited thereto. For example, the second insulator INS2 may have a shape similar to the insulating film INF and may be formed only on the side surface of the partition wall PW. The partition wall PW may be connected to the common electrode CET. However, since an electrical signal capable of emitting light from the partition wall PW is not applied to both ends of the partition wall PW (for example, the first and second semiconductor layers SCL1 and SCL2 of the partition wall PW), the partition wall PW may remain as an inactive light-emitting element.

Each of the first insulator INS1 and the second insulator INS2 may include at least one insulating material, and may be composed of a single layer or multiple layers. For example, each of the first insulator INS1 and the second insulator INS2 may include at least one insulating material of $SiO_2$ or silicon oxide ($SiO_x$) not determined therein, $Si_3N_4$ or silicon nitride ($SiN_x$) not determined therein, $Al_2O_3$ or aluminum oxide ($Al_xO_y$) not determined therein, $TiO_2$ or titanium oxide ($Ti_xO_y$) not determined therein, and hafnium oxide ($HfO_x$), but is not limited thereto.

A reflective layer RFL may be provided on at least a portion of the partition wall PW provided with the insulator INS on the surface thereof. For example, the reflective layer RFL may be provided on the side surface of the partition wall PW to surround the light-emitting areas EMA of the pixels PX. The reflective layer RFL may face each light-emitting element LD. Accordingly, it is possible to increase the light-emitting efficiency of light generated from the light-emitting elements LD.

In an embodiment, the reflective layer RFL may be provided on both the side surface and the upper surface of the partition wall PW as in the embodiment of FIG. 6. In an embodiment, the reflective layer RFL may be provided only on the side surface of the partition wall PW as in the embodiment of FIG. 8, and may not be provided on the upper surface of the partition wall PW. For example, the reflective layer RFL may be provided on at least a portion of the partition wall PW, and at least one portion thereof may be formed to face the light-emitting elements LD in consideration of the light efficiency of the pixels PX.

In an embodiment, the reflective layer RFL may include a single layer or multiple layers of metal layers including at least one type of metal or alloy. For example, the reflective layer RFL may include at least one metal layer including at least one of various metal materials including a metal having a high reflectance in the visible light wavelength band, for example, aluminum (Al), gold (Au), silver (Ag).

In an embodiment, a filler FIL may be formed in each light-emitting area EMA. For example, the filler FIL may fill a space between the light-emitting elements LD (for example, the first, second, and third light-emitting elements LD1, LD2, LD3), the color filters CF (for example, the first, second, and third color filters CF1, CF2, and CF3), and the partition wall PW.

The filler FIL may include a low refractive material matched to a refractive index to increase light-emitting efficiency of each pixel PX. For example, the filler FIL may include a low refractive material (for example, silicon oxide ($SiOx$)) having a refractive index of about 1.4 to 1.6.

The filler FIL may selectively include light scattering particles. For example, the filler FIL may include at least one type of light scattering material including silica.

The light control part LCP may be disposed on the display element part DPL. The light control part LCP may be disposed on a path through which light generated from the light-emitting elements LD is emitted.

The light control part LCP may include color filters CF disposed in the light-emitting area EMA of each pixel PX. For example, the light control part LCP may include a first color filter CF1 disposed in the first light-emitting area EMA1 of the first pixel PX1, a second color filter CF2 disposed in the second light-emitting area EMA2 of the second pixel PX2, and a third color filter CF3 disposed in the third light-emitting area EMA3 of the third pixel PX3.

The first color filter CF1 may be disposed on the first light-emitting element LD1, and may selectively transmit light of a first color emitted from the first light-emitting element LD1. The second color filter CF2 may be disposed on the second light-emitting element LD2, and may selectively transmit light of a second color emitted from the second light-emitting element LD2. The third color filter CF3 may be disposed on the third light-emitting element LD3, and may selectively transmit light of a third color emitted from the third light-emitting element LD3. For example, the first color filter CF1, the second color filter CF2, and the third color filter CF3 may be blue color filters, green color filters, and red color filters that selectively transmit blue, green, and red light, respectively.

In an embodiment, the light control part LCP may further include a black matrix BM disposed in the non-light-emitting area NEA to be disposed between the color filters CF. For example, the light control part LCP may include a black matrix BM that may be disposed on the partition wall PW and may include at least one light-blocking material.

In an embodiment, the light control part LCP may not include the black matrix BM. For example, by disposing the first, second, and third color filters CF1, CF2, and CF3 to overlap each other without forming a separate black matrix BM on the partition wall PW, it is possible to block the transmission of light through the non-light-emitting area NEA.

FIGS. 9 to 24 are schematic cross-sectional views illustrating a manufacturing method of a display device DD according to an embodiment. For example, FIGS. 9 to 24 sequentially illustrate manufacturing steps of the display device DD according to an embodiment of FIG. 6.

Referring to FIGS. 1 to 9, firstly, a manufacturing substrate FSB may be prepared, and at least one buffer layer and a hard mask HM may be sequentially formed on the manufacturing substrate FSB. For example, on the manufacturing substrate FSB, a first buffer layer L1 (or, also referred to as a "first sacrificial layer"), a second buffer layer L2 (or, also referred to as a "second sacrificial layer"), and the hard mask HM may be sequentially formed.

The manufacturing substrate FSB may be a manufacturing substrate for epitaxial growth. The manufacturing substrate FSB may be a commercially available single crystal substrate, but is not limited thereto. In an embodiment, the manufacturing substrate FSB may be a GaAs, GaP, or InP substrate. The manufacturing substrate FSB may include a ZnO substrate having a GaAs layer on the surface thereof. The manufacturing substrate SUB may include a Ge substrate having a GaAs layer on a surface thereof, and a Si substrate having a GaAs layer with a buffer layer interposed therebetween on a Si wafer.

The manufacturing substrate FSB may be a substrate of various types and/or materials. For example, in case that epitaxial growth for manufacturing the light-emitting elements LD can be smoothly performed, the material of the manufacturing substrate FSB is not particularly limited.

The first buffer layer L1 and the second buffer layer L2 may be sequentially formed on the manufacturing substrate FSB. The first buffer layer L1 and the second buffer layer L2 may be formed by the epitaxial growth.

The first buffer layer L1 and the second buffer layer L2 may be disposed between the light-emitting elements LD and the manufacturing substrate FSB in the manufacturing process of the light-emitting elements LD to physically separate the light-emitting elements LD and the manufacturing substrate FSB. The first buffer layer L1 and the second buffer layer L2 may be layers finally separated from the light-emitting elements LD in the manufacturing process of the light-emitting elements LD.

In an embodiment, the first buffer layer L1 may include a semiconductor material such as GaN, GaAs, AlAs, or AlGaAs. Also, the first buffer layer L1 may be formed of an intrinsic semiconductor that is not doped with an impurity.

In an embodiment, the second buffer layer L2 may include the same semiconductor material as the first buffer layer L1. For example, the second buffer layer L2 may include a semiconductor material such as GaN, GaAs, AlAs, or AlGaAs.

In an embodiment, the second buffer layer L2 may include the same semiconductor material (for example, a nitride-based semiconductor material) as the first semiconductor layers SCL1 of the light-emitting elements LD, and may be doped with a first conductivity type (for example, an N type) in the same manner as the first semiconductor layers SCL1 of the light-emitting elements LD.

In an embodiment, according to the process method used to separate the light-emitting elements LD and the manufacturing substrate FSB after manufacturing the light-emitting elements LD, an etching layer and/or a current blocking layer or the like may be selectively further formed on the second buffer layer L2.

The hard mask HM may be for defining an area in which each light-emitting element LD and the partition wall PW are formed, and in case that an etch ratio for forming the area may be satisfied, the material of the hard mask HM is not particularly limited. In an embodiment, the hard mask HM may be formed of $SiO_2$ or silicon oxide ($SiO_x$) not determined therein, but is not limited thereto.

Referring to FIG. 10, a first mask MK1 may be disposed on the hard mask HM. By etching a portion of the hard mask HM, the first light-emitting element area LDA1 and the partition wall area PWA may be opened, or, a trench may be formed.

The first light-emitting element area LDA1 may be an area where the first light-emitting element LD1 is to be formed, and the partition wall area PWA may be an area where the partition wall PW is to be formed. For example, first light-emitting element areas LDA1 and a partition wall areas PWA in which the first light-emitting elements LD1 and the partition walls PW are to be formed may be determined, and the first mask MK1 including openings corresponding to the first light-emitting element areas LDA1 and the partition wall areas PWA may be formed and/or disposed on the hard mask HM. By etching the hard mask HM using the first mask MK1, openings corresponding to the first light-emitting element areas LDA1 and the partition wall areas PWA may be formed in the hard mask HM. In an embodiment, in case that first light-emitting elements LD1 are to be formed on one manufacturing substrate FSB, the hard mask HM may be opened in first light-emitting element areas LDA1 corresponding to the first light-emitting elements LD1.

Referring to FIGS. 11A to 11C, a first light-emitting element LD1 and a partition wall PW may be formed in the first light-emitting element area LDA1 and the partition wall area PWA, respectively. The first light-emitting element LD1 and the partition wall PW may be formed by the epitaxial growth, and may be simultaneously formed using the same material or similar material.

For example, as shown in FIG. 11A, in the first light-emitting element area LDA1 and the partition wall area PWA, first semiconductor layers SCL1 of the first light-emitting element LD1 and the partition wall PW may be first formed. The first semiconductor layers SCL1 of the first light-emitting element LD1 and the partition wall PW may be formed on the second buffer layer L2.

Thereafter, as shown in FIG. 11B, in the first light-emitting element area LDA1 and the partition wall area PWA, the first light-emitting layers EML1 and EML1' of the first light-emitting element LD1 and the partition wall PW may are formed. In the display device DD, the partition wall PW may be electrically isolated, and the first light-emitting layer EML1' of the partition wall PW may be an inactive light-emitting layer NEML.

The first light-emitting layers EML1 and EML1' may be formed to emit light of the first color in case that electrons and holes recombine in the first light-emitting layers EML1 and EML1'. The first light-emitting layers EML1 and EML1' may be formed of a single or multiple quantum well structure. For example, by alternately forming a GaN layer and an InGaN layer on the first semiconductor layers SCL1 of the first light-emitting element LD1 and the partition wall PW, the first light-emitting layers EML1 and EML1' may be formed as multiple layers. By controlling the composition ratio of indium (In) included in the InGaN layer, the first light-emitting layers EML1 and EML1' may be formed so that the first light-emitting layers EML1 and EML1' emit light of the first color (for example, blue).

Thereafter, as shown in FIG. 11C, in the first light-emitting element area LDA1 and the partition wall area PWA, second semiconductor layers SCL2 of the first light-emitting element LD1 and the partition wall PW may be formed. The second semiconductor layers SCL2 of the first light-emitting element LD1 and the partition wall PW may be formed on each of the first light-emitting layers EML1 and EML1'.

After the first light-emitting element LD1 and the partition wall PW are formed, the first mask MK1 may be removed.

In embodiments of FIGS. 6 to 24, the partition wall PW is illustrated as formed simultaneously with the first light-emitting element LD1, but the disclosure is not limited thereto. For example, the partition wall PW may be formed simultaneously with the second light-emitting element LD2 or the third light-emitting element LD3 in the process of forming the second light-emitting element LD2 or the third light-emitting element LD3. The partition wall PW may have the same material or similar material, composition ratio, and/or stacked structure as the second light-emitting element LD2 or the third light-emitting element LD3.

Figure 12:
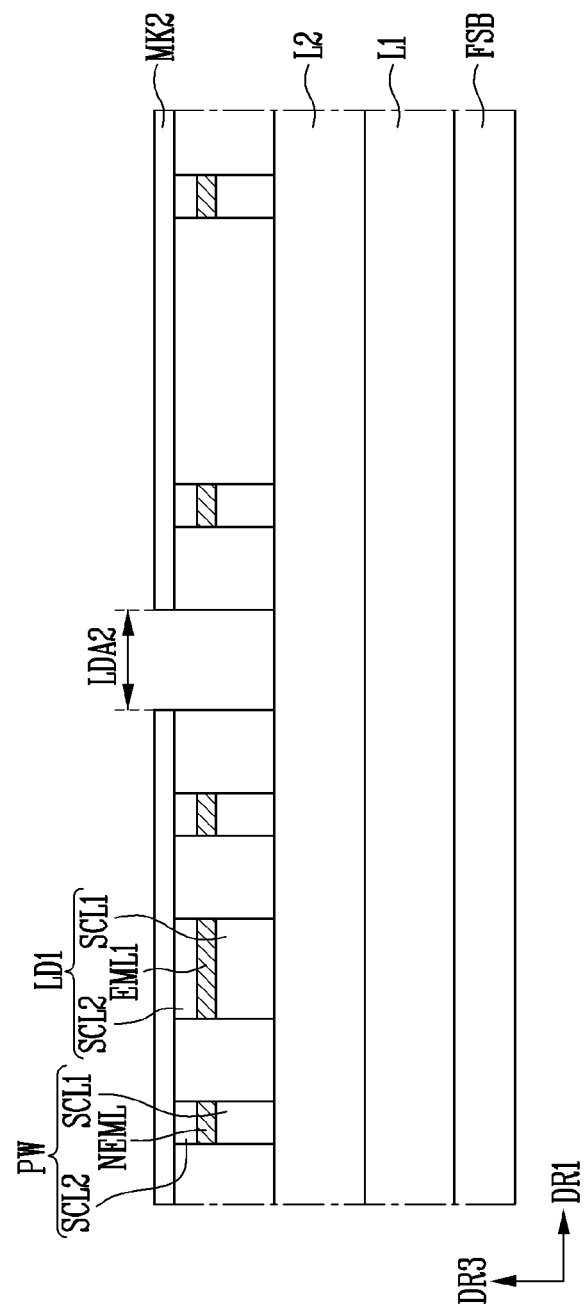

Referring to FIG. 12, a second mask MK2 may be disposed on the hard mask HM. A portion of the hard mask HM may be etched to open the second light-emitting element area LDA2, or, a trench may be formed.

The second light-emitting element area LDA2 may be an area in which the second light-emitting element LD2 is to be formed. For example, a second light-emitting element area LDA2 in which the second light-emitting element LD2 is to be formed is determined, and the second mask MK2 including an opening corresponding to the second light-emitting element area LDA2 may be formed and/or disposed on the hard mask HM. By etching the hard mask HM using the second mask MK2, an opening corresponding to the second light-emitting element area LDA2 may be formed in the hard mask HM. In an embodiment, in case that second light-emitting elements LD2 are to be formed on one manufacturing substrate FSB, the hard mask HM may be opened in the second light-emitting element areas LDA2 corresponding to the second light-emitting elements LD2, respectively.

Figure 13:
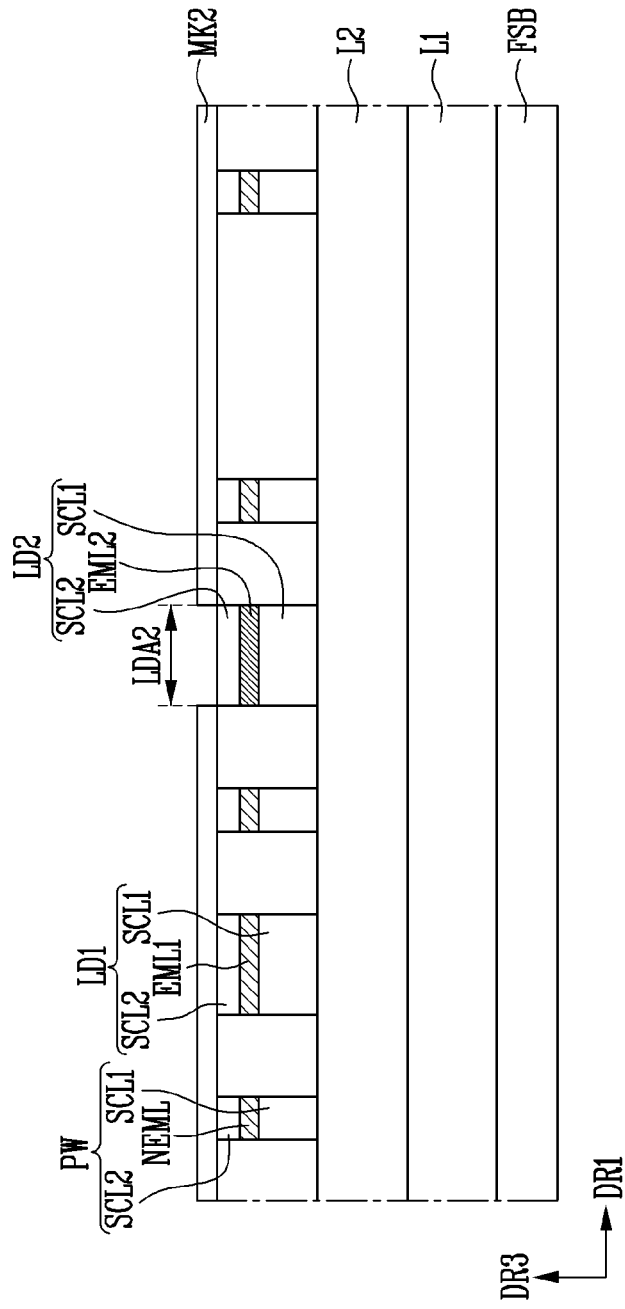

Referring to FIG. 13, the second light-emitting element LD2 may be formed in the second light-emitting element area LDA2. The second light-emitting element LD2 may be formed by the epitaxial growth.

The second light-emitting element LD2 may include the first semiconductor layer SCL1, the second light-emitting layer EML2, and the second semiconductor layer SCL2, and the first semiconductor layer SCL1, the second light-emitting layer EML2, and the second semiconductor layer SCL2 of the second light-emitting element LD2 may be sequentially formed on the second buffer layer L2. For example, in the manner substantially the same as or similar to the method of forming the first light-emitting element LD1 and the partition wall PW shown in FIGS. 11A to 11C, the first semiconductor layer SCL1, the second light-emitting layer EML2, and the second semiconductor layer SCL2 of the second light-emitting element LD2 may be sequentially formed in the second light-emitting element area LDA2 on the second buffer layer L2.

The second light-emitting layer EML2 may be formed to emit light of a second color in case that electrons and holes recombine in the second light-emitting layer EML2. The second light-emitting layer EML2 may be formed in a single or multiple quantum well structure. For example, by alternately forming a GaN layer and an InGaN layer on the first semiconductor layer SCL1 of the second light-emitting element LD2, the second light-emitting layer EML2 may be formed as multiple layers. By controlling the composition ratio of indium (In) included in the InGaN layer, the second light-emitting layer EML2 may be formed so that the second light-emitting layer EML2 may emit light of a second color (for example, green).

In an embodiment, in case that light of a first color and light of a second color to be respectively generated from the first light-emitting element LD1 and the second light-emitting element LD2 are light of different colors, the second light-emitting layer EML2 may be formed to have a material and/or composition ratio different from that of the first light-emitting layer EML1. For example, in the first light-emitting layer EML1 and the second light-emitting layer EML2, the composition ratio of indium (In) may be different.

After the second light-emitting element LD2 is formed, the second mask MK2 may be removed.

Figure 14:
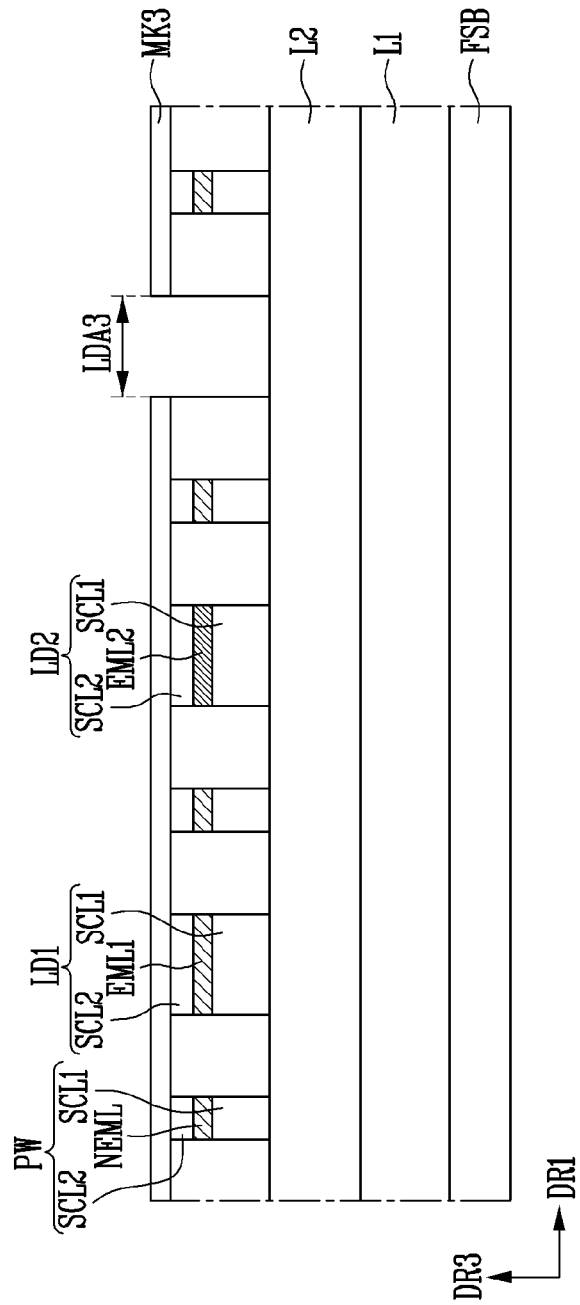

Referring to FIG. 14, a third mask MK3 may be disposed on the hard mask HM. A portion of the hard mask HM may be etched to open the third light-emitting element area LDA3, or, a trench may be formed.

The third light-emitting element area LDA3 may be an area where the third light-emitting element LD3 is to be formed. For example, a third light-emitting element area LDA3 in which the third light-emitting element LD3 is to be formed may be determined, and a third mask MK3 including an opening corresponding to the third light-emitting element area LDA3 may be formed and/or disposed on the hard mask HM. By etching the hard mask HM using the third mask MK3, an opening corresponding to the third light-emitting element area LDA3 may be formed in the hard mask HM. In an embodiment, in case that third light-emitting elements LD3 are to be formed on one manufacturing substrate FSB, the hard mask HM may be opened in the third light-emitting element areas LDA3 corresponding to the third light-emitting elements LD3, respectively.

Figure 15:
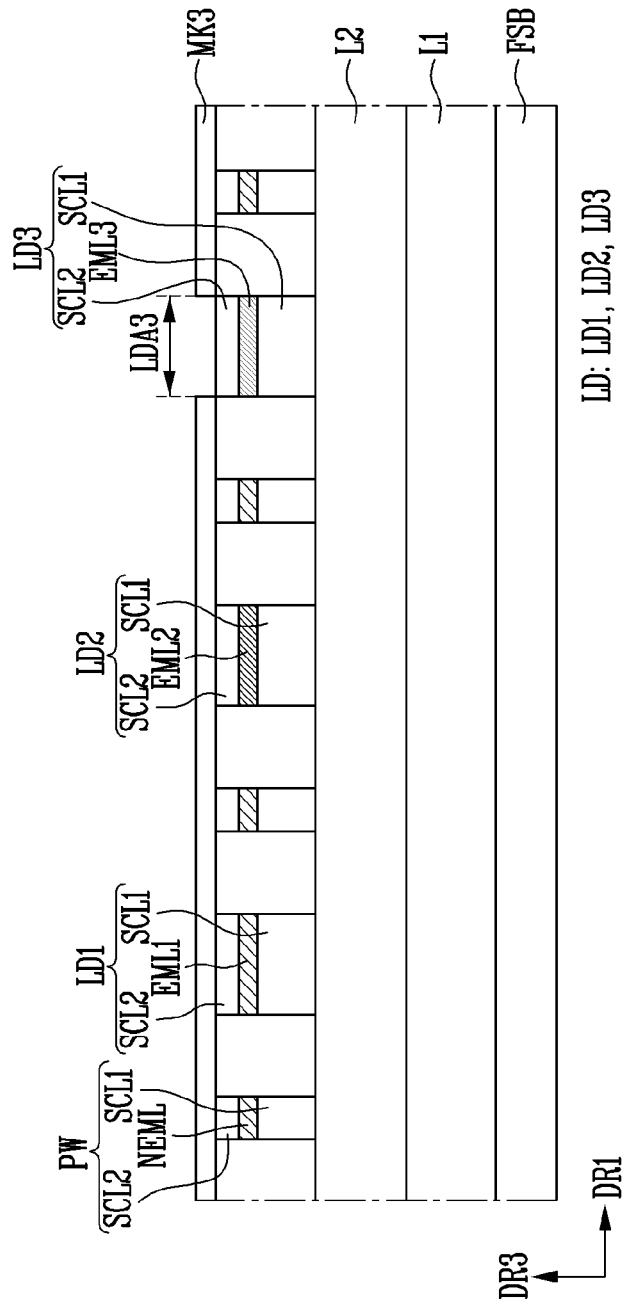

Referring to FIG. 15, the third light-emitting element LD3 may be formed in the third light-emitting element area LDA3. The third light-emitting element LD3 may be formed by the epitaxial growth.

The third light-emitting element LD3 may include the first semiconductor layer SCL1, the third light-emitting layer EML3, and the second semiconductor layer SCL2, and the first semiconductor layer SCL1, the third light-emitting layer EML3, and the second semiconductor layer SCL2 of the third light-emitting element LD3 may be sequentially formed on the second buffer layer L2. For example, in the manner substantially the same as or similar to the method of forming the first light-emitting element LD1 and the partition wall PW shown in FIGS. 11A to 11C, the first semiconductor layer SCL1, the third light-emitting layer EML3, and the second semiconductor layer SCL2 of the third light-emitting element LD3 may be sequentially formed in the third light-emitting element area LDA3 on the second buffer layer L2.

The third light-emitting layer EML3 may be formed to emit light of a third color in case that electrons and holes recombine in the third light-emitting layer EML3. The third light-emitting layer EML3 may be formed in a single or multiple quantum well structure. For example, by alternately forming a GaN layer and an InGaN layer on the first semiconductor layer SCL1 of the third light-emitting element LD3, the third light-emitting layer EML3 may be formed as multiple layers. By controlling the composition ratio of indium (In) included in the InGaN layer, the third light-emitting layer EML3 may be formed so that the third light-emitting layer EML3 may emit light of a third color (for example, red).

In an embodiment, in case that light of the first color, light of the second color, and light of the third color to be generated from the first light-emitting element LD1, the second light-emitting element LD2, and the third light-emitting element LD3, respectively, are light of different colors, the first light-emitting layer EML1, the second light-emitting layer EML2, and the third light-emitting layer EML3 may be formed to have different materials and/or composition ratios. For example, each of the first light-emitting layer EML1, the second light-emitting layer EML2, and the third light-emitting layer EML3 may include an InGaN layer, and the composition ratio of indium (In) may be different in the InGaN layers of the first light-emitting layer EML1, the second light-emitting layer EML2, and the third light-emitting layer EML3.

After the third light-emitting element LD3 is formed, the third mask MK3 may be removed.

Referring to FIG. 16, a fourth mask MK4 may be disposed on the manufacturing substrate FSB on which the first, second, and third light-emitting elements LD1, LD2, and LD3 and the partition wall PW are formed, and the first insulator INS1 may be formed on the partition wall PW using the mask MK4. The fourth mask MK4 may has an opening corresponding to the partition wall PW, and may cover or overlap the remaining areas including upper portions of the first, second, and third light-emitting elements LD1, LD2, and LD3.

After the first insulator INS1 is formed, the fourth mask MK4 may be removed.

Referring to FIG. 17, after the first, second, and third light-emitting elements LD1, LD2, and LD3, the partition wall PW, and the first insulator INS1 are formed, the hard mask HM may be removed. The hard mask HM may be removed through an etching process or the like within the spirit and the scope of the disclosure.

Figure 18:
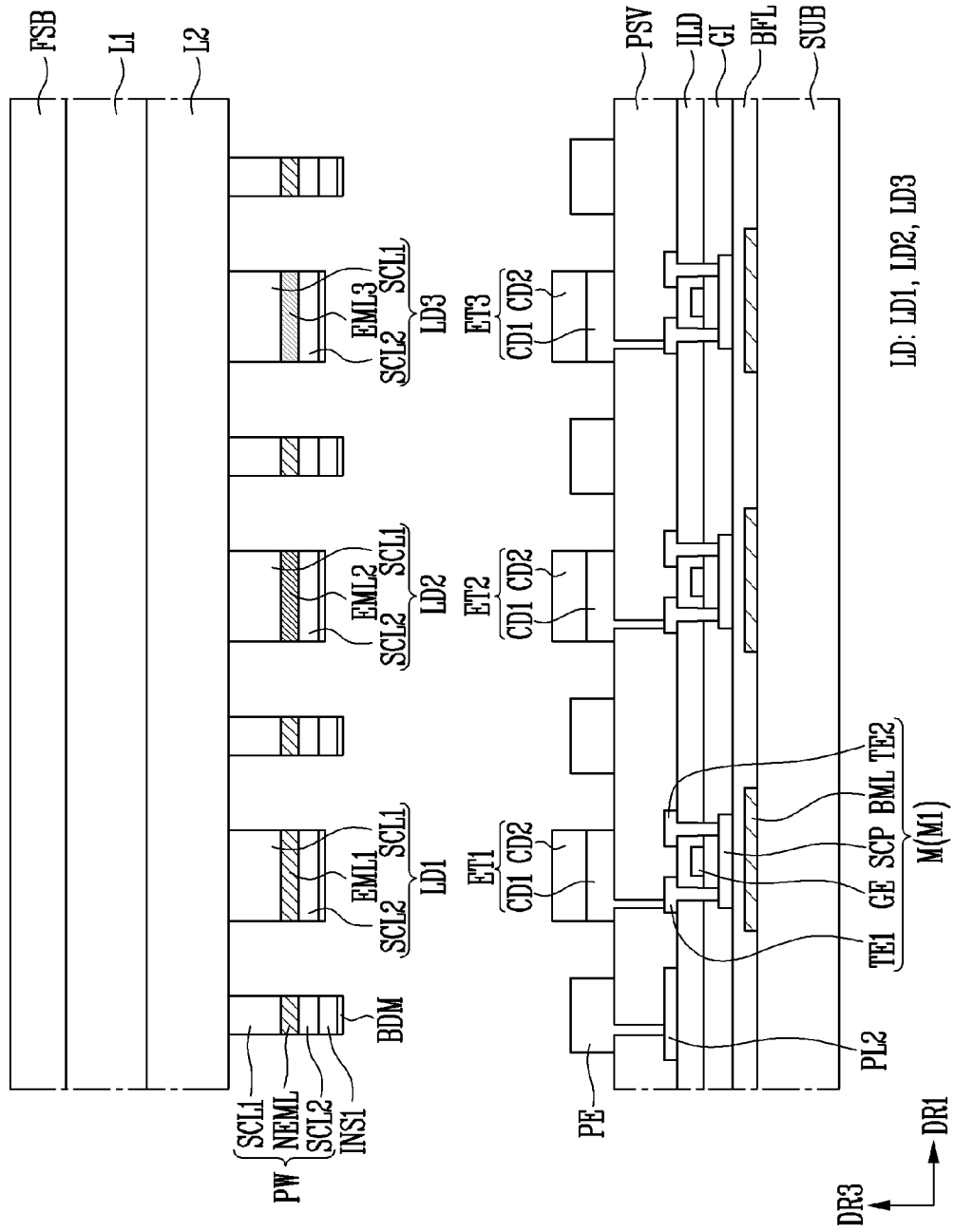

Referring to FIG. 18, a driving substrate including a first electrode ET1, a second electrode ET2, a third electrode ET3, and pad electrodes PE is prepared. For example, a pixel circuit part PCL may be formed on the substrate SUB, and the first electrode ET1, the second electrode ET2, the third electrode ET3, and the pad electrodes PE may be formed on the pixel circuit part PCL to manufacture a driving substrate. For example, the driving substrate may be a configuration including the substrate SUB, the pixel circuit part PCL, the first electrode ET1, the second electrode ET2, the third electrode ET3, and the pad electrodes PE.

Thereafter, so that the first electrode ET1, the second electrode ET2, and the third electrode ET3 face the first light-emitting element LD1, the second light-emitting element LD2, and the third light-emitting element LD3, respectively, the manufacturing substrate FSB may be aligned on the driving substrate. The pad electrodes PE may be aligned to face the partition wall PW.

In an embodiment, a bonding material BDM may also be applied on one surface or a surface of the light-emitting elements LD and/or the first insulator INS1 (for example, one surface or a surface facing the driving substrate) for easier bonding. In an embodiment, the bonding material BDM may be a metal, for example, the same material or similar material as the pad electrodes PE and/or the first, second and third electrodes ET1, ET2, ET3 (for example, the second conductive patterns CD2 of the first, second, and third electrodes ET1, ET2, and ET3), but is not limited thereto. The bonding material BDM may be applied on the manufacturing substrate FSB before or after removing the hard mask HM. However, the disclosure is not limited thereto, and a separate bonding material BDM may not be applied on one surface or a surface (for example, one surface or a surface facing the driving substrate) of the light-emitting elements LD and/or the first insulator INS1.

Figure 19:
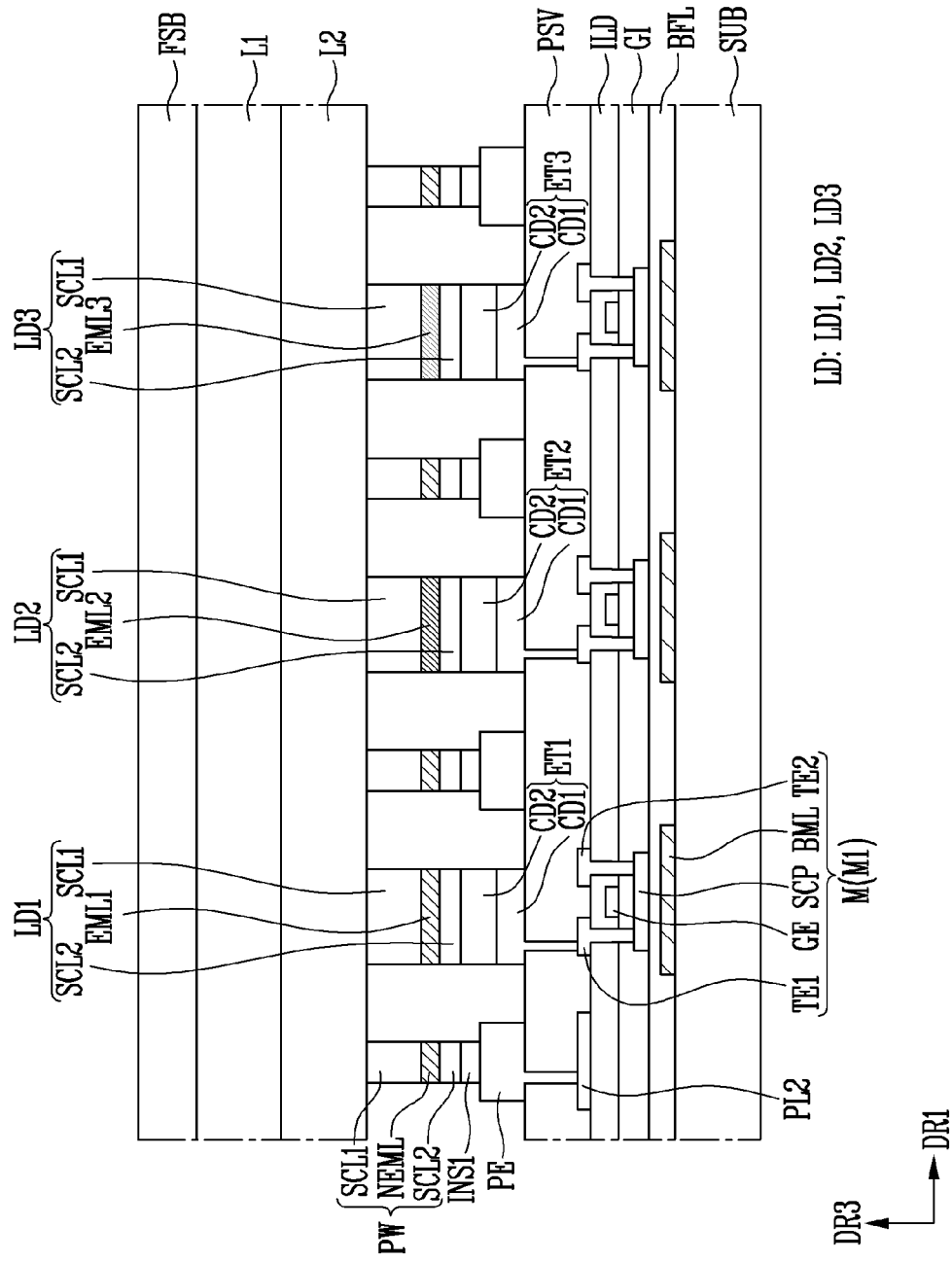

Referring to FIG. 19, the driving substrate and the manufacturing substrate FSB may be bonded to each other so that the first electrode ET1, the second electrode ET2, and the third electrode ET3 are connected to the first light-emitting element LD1, the second light-emitting element LD2, and the third light-emitting element LD3, respectively. For example, the first light-emitting element LD1, the second light-emitting element LD2, and the third light-emitting element LD3 are bonded on the first electrode ET1, the second electrode ET2, and the third electrode ET3, respectively, to electrically connected to the first electrode ET1, the second electrode ET2, and the third electrode ET3.

Figure 20:
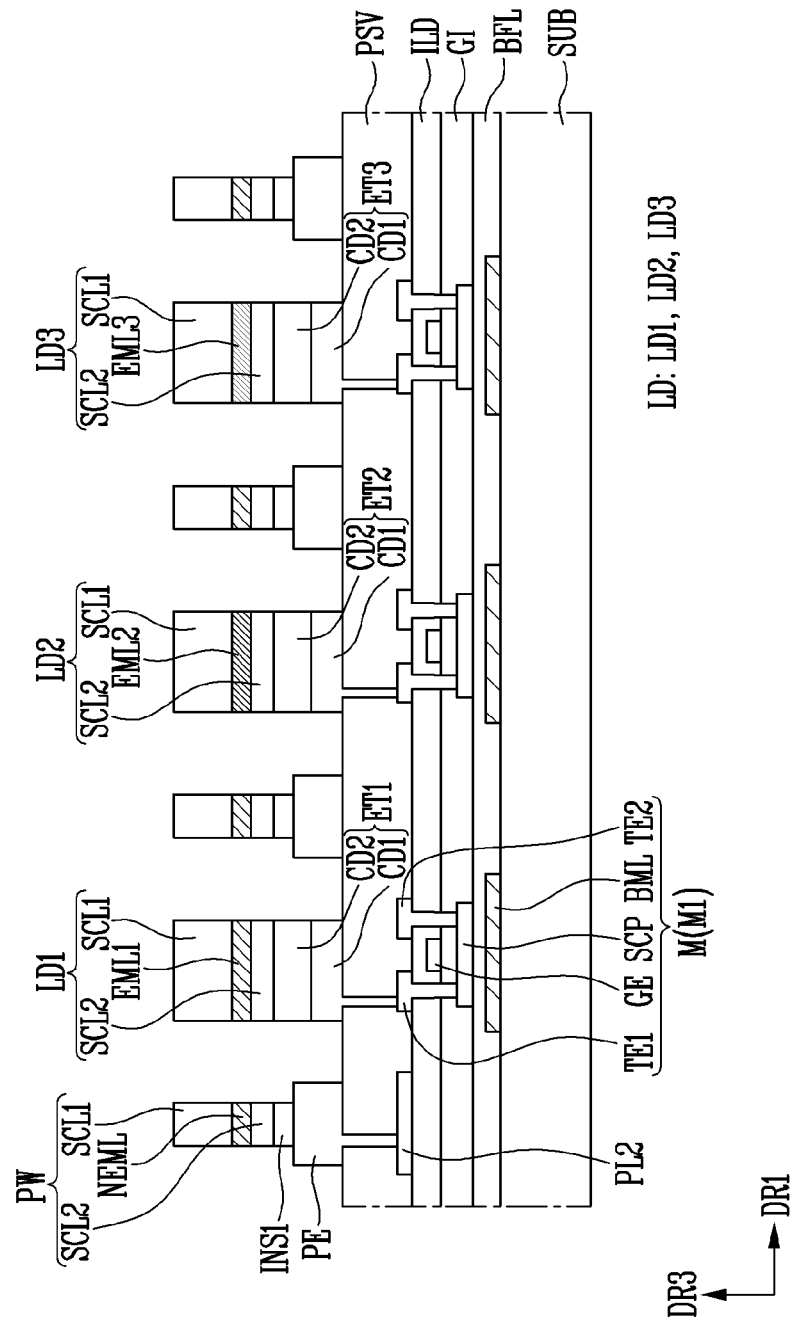

Referring to FIG. 20, the manufacturing substrate FSB may be removed. For example, the manufacturing substrate FSB may be separated from the first, second, and third light-emitting elements LD1, LD2, LD3 and the partition wall PW through laser lift or chemical etching, and the first, second, and third light-emitting elements LD1, LD2, and LD3 and the partition wall PW may remain on the driving substrate.

Figure 21:
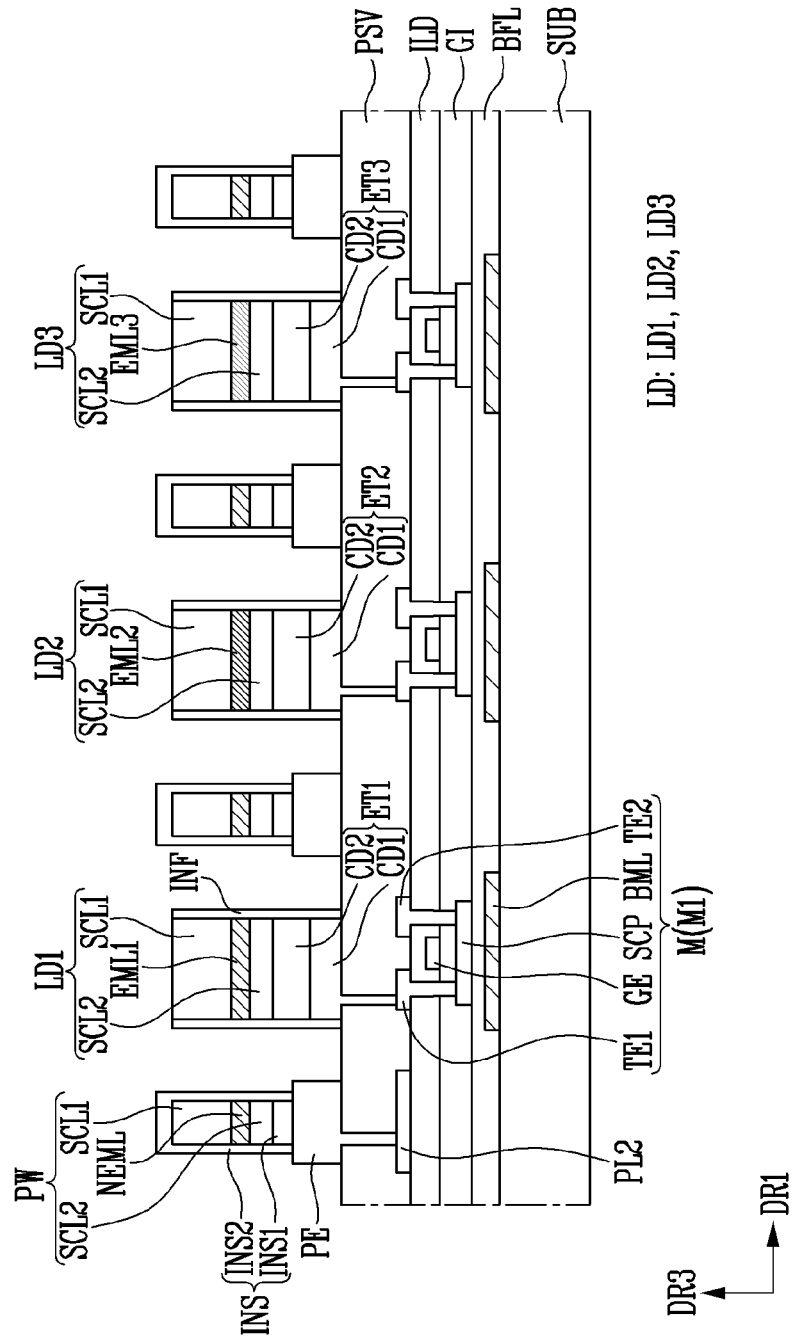

Referring to FIG. 21, the insulating film INF may be formed on side surfaces of the first, second, and third light-emitting elements LD1, LD2, and LD3, and a second insulator INS2 may be formed on the surface of the partition wall PW. For example, an insulating layer may be formed by applying an insulating material on the driving substrate on which the first, second, and third light-emitting elements LD1, LD2, and LD3 and the partition wall PW are disposed, and the insulating layer may be selectively etched to form the insulating film INF and the second insulator INS2.

In an embodiment, the second insulator INS2 may be formed on the upper and side surfaces of the partition wall PW, but is not limited thereto. For example, in an embodiment, the second insulator INS2 may be formed only on the side surface of the partition wall PW in a form similar to the insulating film INF.

Figure 22:
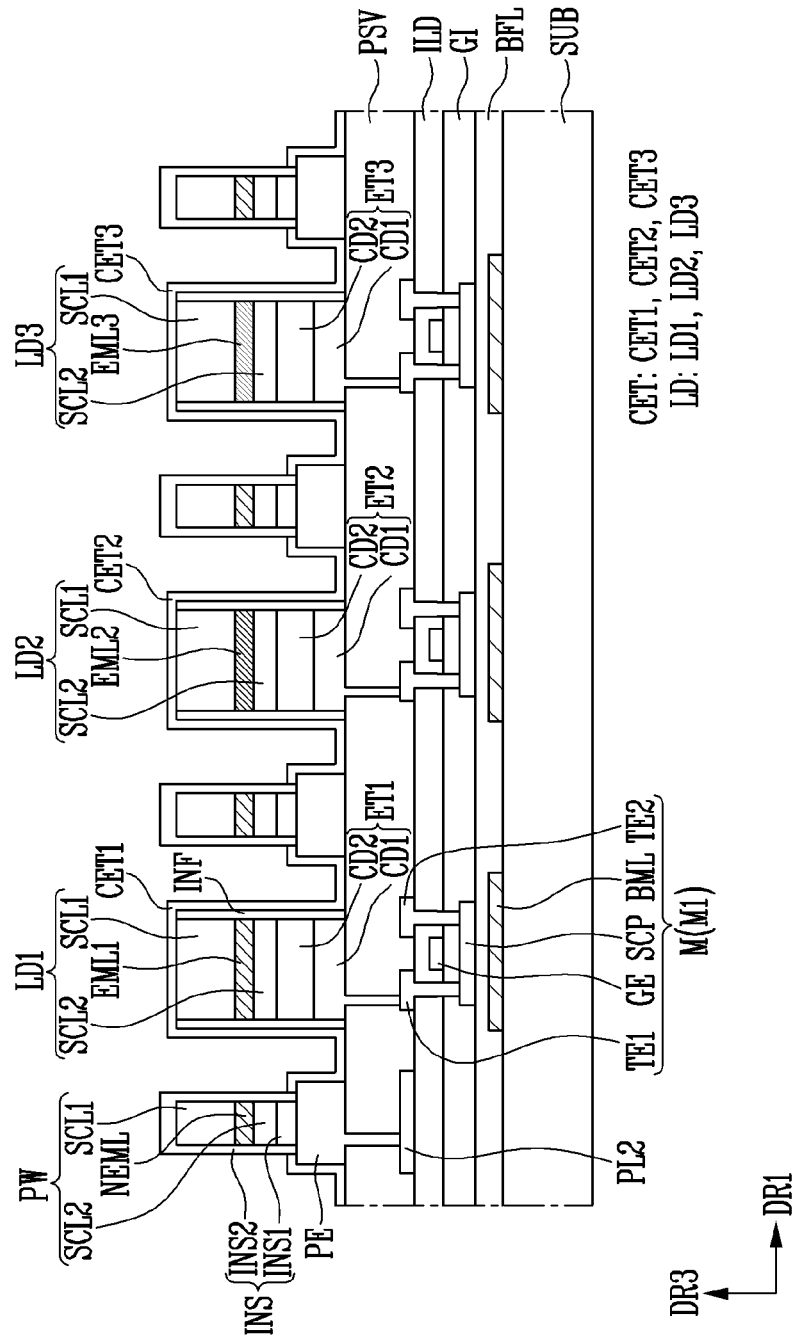

Referring to FIG. 22, a common electrode CET may be formed on a driving substrate on which the first, second, and third light-emitting elements LD1, LD2, and LD3 and the partition wall PW are disposed. The common electrode CET may include a fourth electrode CET1, a fifth electrode CET2, and a sixth electrode CET3 disposed on a portion (for example, an upper surface) of the first light-emitting element LD1, the second light-emitting element LD2, and the third light-emitting element LD3, respectively. For example, the common electrode CET may be formed by applying a transparent conductive material on the driving substrate on which the first, second, and third light-emitting elements LD1, LD2, LD3 and the partition wall PW are disposed. In an embodiment, the common electrode CET may be formed on the first, second, and third light-emitting elements LD1, LD2, LD3 and the pad electrodes PE so as to contact a portion (for example, an upper surface) of each of the first, second, and third light-emitting elements LD1, LD2, and LD3 and a portion (for example, a side surface) of the pad electrodes PE.

The common electrode CET may be removed by etching on the partition wall PW as in the embodiment of FIG. 22. Loss of light through the common electrode CET may be reduced or prevented. By way of example, the common electrode CET may be entirely formed on the display element part DPL as in the embodiment of FIG. 7. The process can be simplified and the resistance of the common electrode CET may be lowered.

Figure 23:
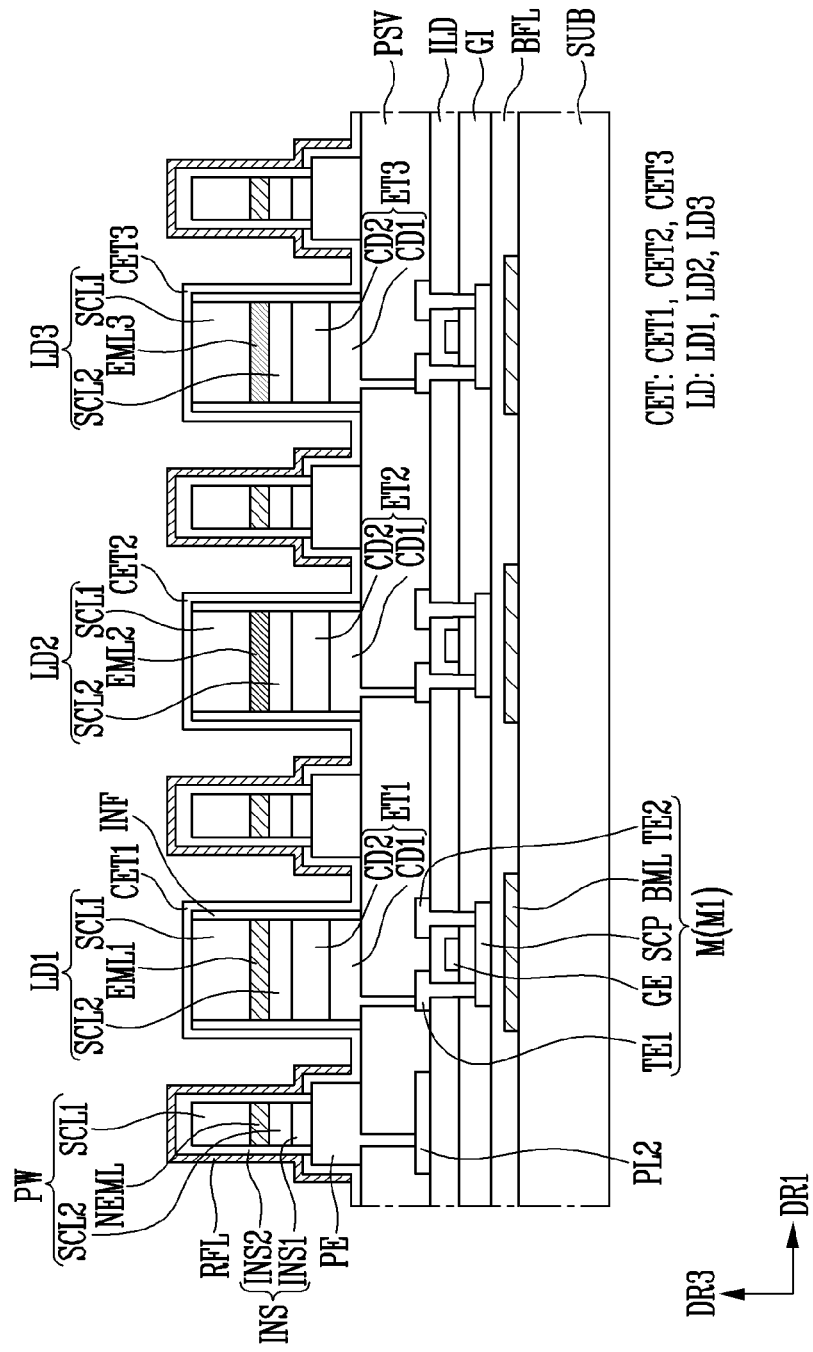

Referring to FIG. 23, a reflective layer RFL may be formed on the second insulator INS2. The reflective layer RFL may be formed on the partition wall PW to surround each light-emitting area EMA. The reflective layer RFL may be formed on the upper and side surfaces of the partition wall PW as in the embodiment of FIG. 6. By way of example, the reflective layer RFL may be removed from the upper surface of the partition wall PW and may be formed only on the side surface of the partition wall PW as in the embodiment of FIG. 8.

Figure 24:
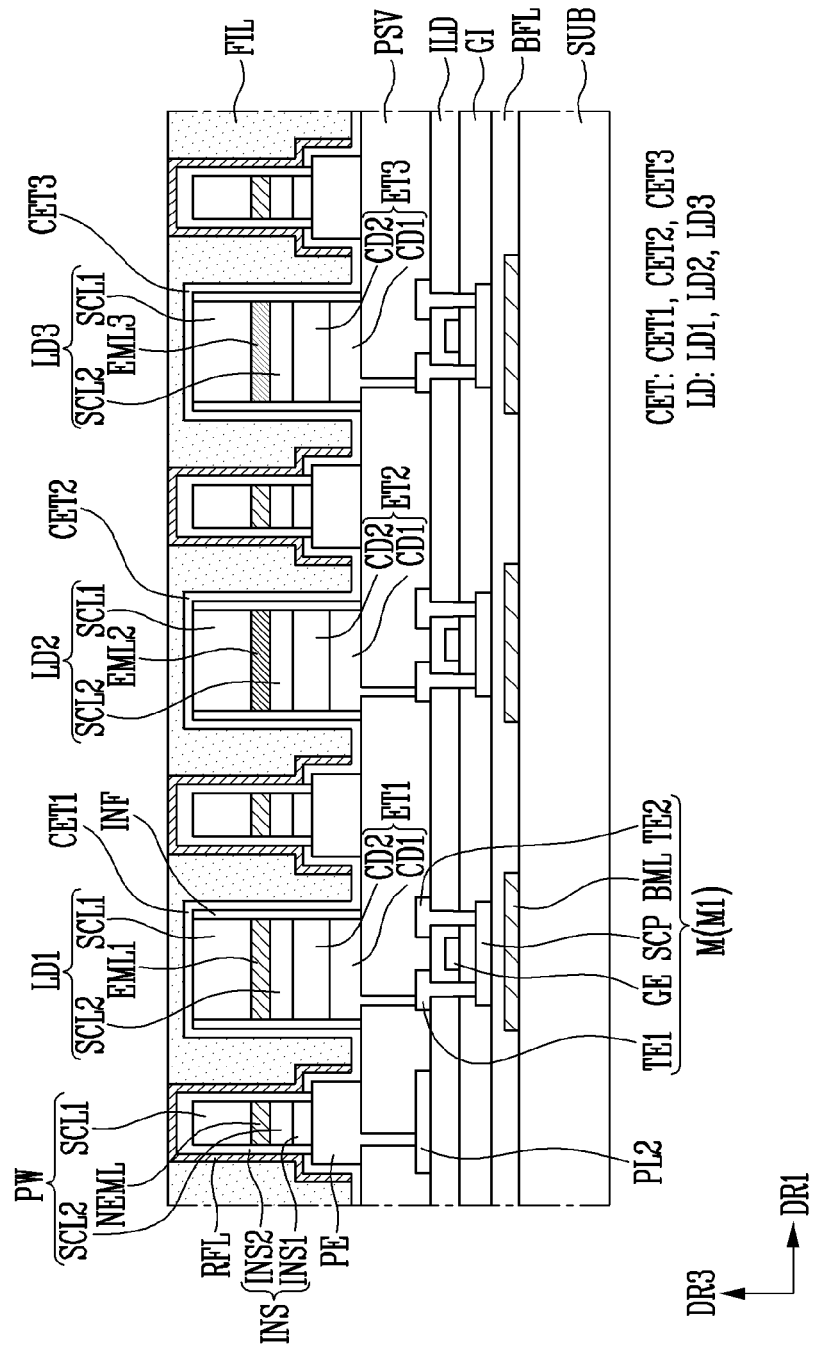

Referring to FIG. 24, the filler FIL may be formed in a space between the first, second, and third light-emitting elements LD1, LD2, and LD3 and the partition wall PW. In an embodiment, the filler FIL may include light scattering particles. The type of the low refractive material used to form the filler FIL and/or the step of forming the filler FIL may be variously changed according to embodiments.

Thereafter, the color filters CF and the black matrix BM shown in FIG. 6 may be formed. For example, the first, second, and third color filters CF1, CF2, and CF3 may be formed in the first, second, and third light-emitting areas EMA1, EMA2, and EMA3 so as to be disposed on the first, second, and third light-emitting elements LD1, LD2, LD3, respectively. A black matrix BM may be formed in the non-light-emitting area NEA so as to be disposed on the partition wall PW.

According to the embodiments of the disclosure as described above, by disposing the light-emitting elements LD of different colors (for example, the first light-emitting element LD1, the second light-emitting element LD2, and the third light-emitting element LD3) in the pixels PX for emitting light of different colors, it is possible to provide a display device DD having a simplified structure and a reduced thickness. For example, the first pixel PX1, the second pixel PX2, and the third pixel PX3 that emits light of the first color, light of the second color, and light of the third color, respectively, may be formed without forming a separate wavelength conversion layer (or color conversion layer) on the display device DD.

According to various embodiments, light-emitting elements LD of different colors may be formed on one manufacturing substrate FSB. For example, the first light-emitting element LD1, the second light-emitting element LD2, and the third light-emitting element LD3 may be sequentially grown to be manufactured on one manufacturing substrate FSB. Accordingly, a bonding process for connecting the light-emitting elements LD of different colors to the driving substrate may be simplified or minimized, and manufacturing efficiency of the display device DD may be improved. For example, through only one bonding process, the first light-emitting element LD1, the second light-emitting element LD2, and the third light-emitting element LD3 may be bonded to the first electrode ET1, the second electrode ET2, and the third electrode ET3, respectively.

According to various embodiments, in a process of forming the light-emitting elements LD of one color, for example, the first light-emitting elements LD1 emitting light of the first color, the partition wall PW surrounding the pixels PX may be formed simultaneously with the first light-emitting elements LD1. Accordingly, the manufacturing process of the display device DD can be simplified and manufacturing efficiency can be improved.

FIGS. 25 to 28 are schematic perspective views illustrating an electronic device according to respective embodiments. For example, FIGS. 25 to 28 illustrate other embodiments of an electronic device to which the display device DD according to the above-described embodiments can be applied.

Figure 25:
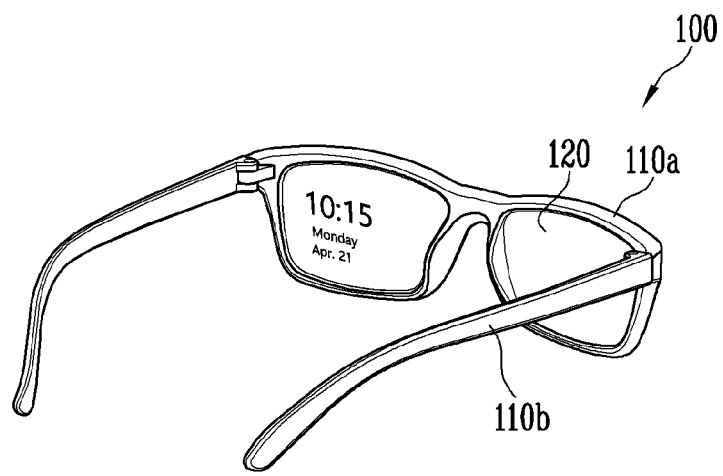
FIGS. 25 to 28 are schematic perspective views illustrating an electronic device according to respective embodiments.

Referring to FIG. 25, the display device DD according to an embodiment may be applied to a smart glass 100 including a frame 110 and a lens unit 120 or lens. The smart glass 100 may be a wearable electronic device that can be worn on a user's face, and may have a structure in which a part of the frame 110 is folded or unfolded. For example, the smart glass 100 may be a wearable device for augmented reality (AR).

The frame 110 may include a housing 110a supporting the lens unit 120 and a leg part 110b for wearing by a user. The leg part 110b may be folded or unfolded by being connected to the housing 110a by a hinge.

A battery, a touch pad, a microphone, a camera, and the like may be embedded in the frame 110. A projector for outputting light, a processor for controlling an optical signal, and the like may be embedded in the frame 110.

The lens unit 120 may be an optical member that transmits light or reflects light. The lens unit 120 may include glass, transparent synthetic resin, or the like within the spirit and the scope of the disclosure.

The lens unit 120 may reflect an image by an optical signal transferred from the projector of the frame 110 by a rear surface of the lens unit 120 (for example, a surface facing the user's eyes) so that the user's eyes can recognize it. For example, the user may recognize information such as time and date displayed on the lens unit 120. For example, the lens unit 120 may be a type of display device, and the display device DD according to the embodiment may be applied to the lens unit 120.

Figure 26:
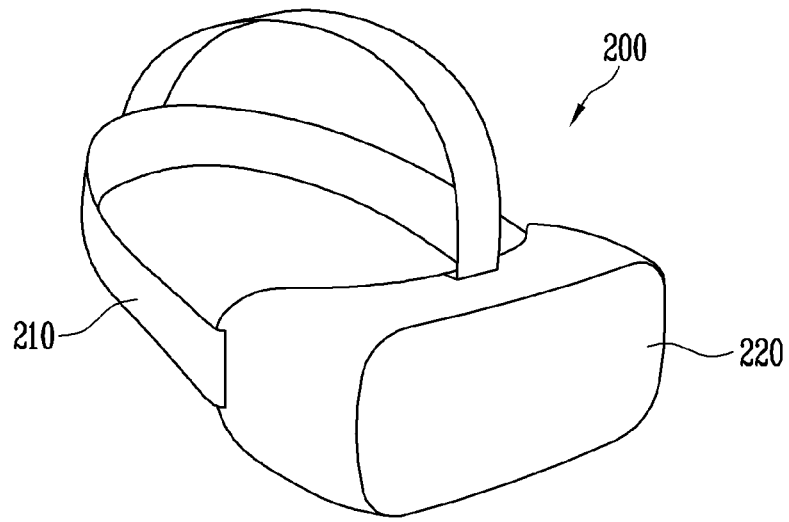

Referring to FIG. 26, the display device DD according to an embodiment may be applied to a head mounted display (HMD) 200 including a head mounting band 210 and a display storage case 220. The head mounted display 200 may be a wearable electronic device that can be worn on the user's head.

The head mounting band 210 may be connected to the display storage case 220 and fix the display storage case 220. In the drawings, the head mounting band 210 is shown to be capable of surrounding an upper surface and both sides of the user's head, but the disclosure is not limited thereto. The head mounting band 210 may be for fixing the head mounted display 200 to the user's head, and may be formed in the form of an eyeglass frame or a helmet.

The display storage case 220 may accommodate the display device DD, and may include at least one lens. At least one lens may be a part that provides an image to a user. For example, the display device DD according to an embodiment may be applied to a left-eye lens and a right-eye lens implemented in the display storage case 220.

Figure 27:
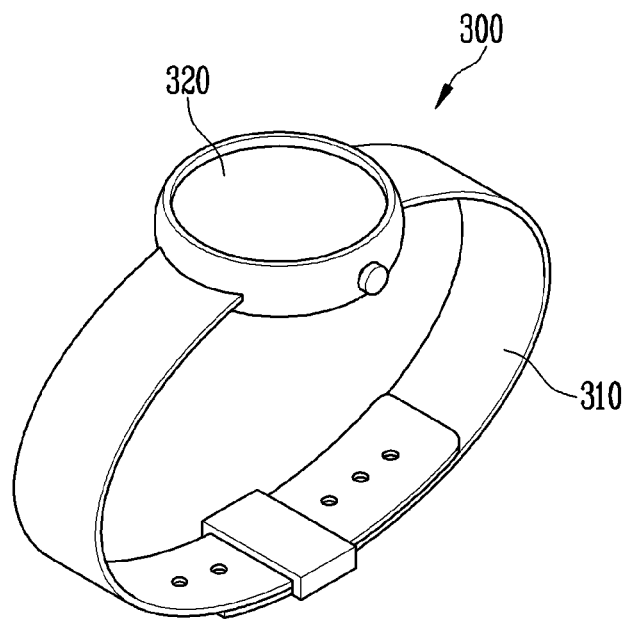

Referring to FIG. 27, the display device DD according to an embodiment may be applied to a smart watch 300 including a strap unit 310 or strap and a display unit 320 or display.

The smart watch 300 may be a wearable electronic device, and may have a structure in which the strap unit 310 is mounted on a user's wrist. Here, the display device DD according to an embodiment is applied to the display unit 320 so that image data including time information may be provided to the user.

Figure 28:
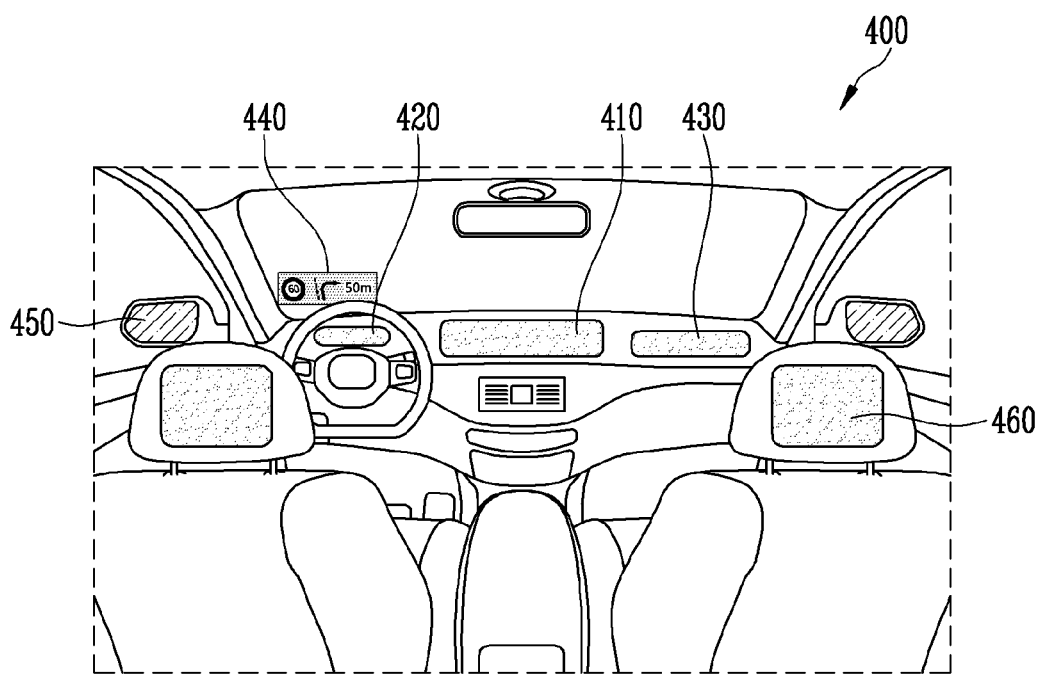

Referring to FIG. 28, the display device DD according to an embodiment may be applied to an automotive display 400. Here, the automotive display 400 may refer to an electronic device provided inside and/or outside of a vehicle to provide image data.

According to an embodiment, the display device DD may be applied to at least one of an infotainment panel 410, a cluster 420, a co-driver display 430, a head-up display 440, a side mirror display 450, and a rear seat display 460 that mounted on a vehicle.

The disclosure has been described according to the embodiments, but it should be noted that the foregoing embodiments are provided only for illustration while not limiting the disclosure. In addition, it will be understood by those skilled in the art that various changes in form and details may be made therein without departing from the scope of the disclosure.

The scope of the disclosure may be determined by the accompanying claims. All changes or modifications that come within the meaning and range of the claims and their equivalents will be interpreted as included within the range of the disclosure.

What is claimed is:

1. A display device comprising:
   pixels including:
   a first pixel; and
   a second pixel;
   a first electrode disposed in a light-emitting area of the first pixel;
   a first light-emitting element disposed on the first electrode and electrically connected to the first electrode, the first light-emitting element including a first light-emitting layer emitting light of a first color;
   a second electrode disposed in a light-emitting area of the second pixel;
   a second light-emitting element disposed on the second electrode and electrically connected to the second electrode, the second light-emitting element including a second light-emitting layer emitting light of a second color;
   a bank disposed around the pixels to surround the light-emitting area of the first pixel and the light-emitting area of the second pixel, and including an inactive light-emitting layer of a same material as the first light-emitting layer, and
   an insulator disposed on a surface of the bank that electrically isolates the bank, wherein
      the first light-emitting element includes a light-emitting stack including;
      the first light-emitting layer;
      a first semiconductor layer disposed on the first light-emitting layer; and
      a second semiconductor layer disposed between the first electrode and the first light-emitting layer,
   the bank includes a light-emitting stack, the light-emitting stack of the bank and the light-emitting stack of the first light-emitting element having a same stacked structure, and the light-emitting stack of the bank is in direct contact only with the insulator.

2. The display device of claim 1, wherein the first light-emitting layer and the inactive light-emitting layer include a same nitride-based semiconductor material, and include multiple layers having a same stacked structure,
   the light-emitting stack having a staircase structure in cross-sectional view.

3. The display device of claim 1, wherein
   the pixels further include a third pixel, and
   the third pixel includes:
   a third electrode disposed in a light-emitting area of the third pixel; and
   a third light-emitting element disposed on the third electrode and electrically connected to the third electrode, and including a third light-emitting layer emitting light of a third color.

4. The display device of claim 3, wherein
   the first light-emitting element, the second light-emitting element, and the third light-emitting element and the bank are disposed at a same height with respect to a substrate.

5. The display device of claim 3, further comprising:
   a common electrode disposed on the first light-emitting element, the second light-emitting element, and the third light-emitting element.

6. The display device of claim 5, further comprising:
   a pad electrode disposed below the bank and electrically connected to the common electrode; and
   a first insulator disposed between the bank and the pad electrode.

7. The display device of claim 3, further comprising:
   a reflective layer disposed on a side surface of the bank and surrounding the light-emitting areas of the first pixel, the second pixel, and the third pixel,
   the reflective layer being separate and distinct from the first and second electrodes.

8. The display device of claim 3, further comprising at least one of:
   a first color filter, a second color filter, and a third color filter disposed on the first light-emitting element, the second light-emitting element, and the third light-emitting element, respectively;
   a filler disposed below the first color filter, the second color filter, and the third color filter and adjacent to the first light-emitting element, the second light-emitting element, the third light-emitting element, and the bank; and
   a black matrix disposed on the bank.

9. The display device of claim 1, further comprising a cladding layer provided under the first light-emitting layer, the cladding layer being doped with a conductive dopant.

* * * * *